United States Patent
Kim et al.

(10) Patent No.: US 11,152,536 B2
(45) Date of Patent: Oct. 19, 2021

(54) PHOTORESIST CONTACT PATTERNING OF QUANTUM DOT FILMS

(71) Applicant: The Board of Trustees of the University of Illinois, Urbana, IL (US)

(72) Inventors: Seok Kim, Champaign, IL (US); Moonsub Shim, Savoy, IL (US); Jun Kyu Park, Champaign, IL (US); Hohyun Keum, Champaign, IL (US); Yiran Jiang, Freemont, CA (US)

(73) Assignee: THE BOARD OF TRUSTEES OF THE UNIVERSITY OF ILLINOIS, Urbana, IL (US)

( * ) Notice: Subject to any disclaimer, the term of this patent is extended or adjusted under 35 U.S.C. 154(b) by 134 days.

(21) Appl. No.: 16/572,861

(22) Filed: Sep. 17, 2019

(65) Prior Publication Data
US 2020/0091375 A1  Mar. 19, 2020

Related U.S. Application Data

(60) Provisional application No. 62/732,195, filed on Sep. 17, 2018.

(51) Int. Cl.
  *H01L 33/50*  (2010.01)
  *H01L 33/06*  (2010.01)

(52) U.S. Cl.
  CPC .......... *H01L 33/06* (2013.01); *H01L 33/505* (2013.01); *H01L 33/507* (2013.01); *H01L 2933/0041* (2013.01); *H01L 2933/0058* (2013.01)

(58) Field of Classification Search
  CPC ............... H01L 33/505; H01L 33/507; H01L 2933/041; H01L 2933/0058; H01L 33/06; B81C 1/00373; B81C 1/0038; B81C 1/046
See application file for complete search history.

(56) References Cited

U.S. PATENT DOCUMENTS 7,622,367 B1 * 11/2009 Nuzzo ................ H01L 27/1285
                                                                 438/472
8,193,010 B2    6/2012 Gopal et al.
(Continued)

FOREIGN PATENT DOCUMENTS

EP      1 807 863 B1    12/2015

OTHER PUBLICATIONS

Bae et al., "Single-Step Synthesis of Quantum Dots with Chemical Composition Gradients," *Chem. Mater.*, 20:2, pp. 531-539 (2008).
(Continued)

*Primary Examiner* — Michael M Trinh
(74) *Attorney, Agent, or Firm* — Crowell & Moring LLP

(57) ABSTRACT

The present disclosure describes one or more embodiment of a method for creating a patterned quantum dot layer. The method includes bringing a patterning stamp in contact with a layer of quantum dots disposed on a substrate, the patterning stamp comprising a patterned photoresist layer disposed on an elastomer layer, such that a portion of the quantum dots in contact with the patterned photoresist layer adheres to the patterning stamp, the portion of the quantum dots being adhered quantum dots. The method also includes peeling the patterning stamp from the substrate with a peeling speed larger than a pre-determined peeling speed to remove the adhered quantum dots from the substrate. A remaining portion of the quantum dots forms a patterned quantum dot layer on the substrate.

10 Claims, 19 Drawing Sheets
(13 of 19 Drawing Sheet(s) Filed in Color)

(56) References Cited

U.S. PATENT DOCUMENTS

| | | | | |
|---|---|---|---|---|
| 8,480,942 | B2* | 7/2013 | Shannon | G03F 7/0002 264/293 |
| 8,685,528 | B2* | 4/2014 | Xie | C09J 7/26 428/174 |
| 9,666,821 | B2 | 5/2017 | Park et al. | |
| 10,026,913 | B2 | 7/2018 | Kim et al. | |
| 10,108,089 | B2 | 10/2018 | Gu et al. | |
| 2008/0218068 | A1 | 9/2008 | Cok | |
| 2013/0098540 | A1* | 4/2013 | Lee | H01L 29/78684 156/230 |
| 2015/0352586 | A1* | 12/2015 | Kim | B05C 11/00 427/256 |
| 2018/0100046 | A1* | 4/2018 | Kim | B05D 1/26 |
| 2019/0006180 | A1* | 1/2019 | Kim | H01L 21/3065 |

OTHER PUBLICATIONS

Bae et al., "R/G/B/Natural White Light Thin Colloidal Quantum Dot-Based Light-Emitting Devices," *Advanced Materials*, vol. 26, pp. 6387-6393 (2014).

Bronstein et al., "Quantum Dot Luminescent Concentrator Cavity Exhibiting 30-Fold Concentration," *ACS Photonics* vol. 2, pp. 1576-1583 (2015).

Chen et al., "Compact High-Quality CdSe—CdS Core-Shell Nanocrystals with Narrow Emission Linewidths and Suppressed Blinking," *Nature Materials*, vol. 12, pp. 445-451 (2013).

Choi et al., "Wearable red-green-blue quantum dot light-emitting diode array using high-resolution intaglio transfer printing," *Nature Communications.*, vol. 6, pp. 1-8 (2015).

Dalal "Calculation of Solid Surface Tensions," *Langmuir*, vol. 3, pp. 1009-1015 (1987).

Eisenhaure et al., "The Use of Shape Memory Polymers for MEMS Assembly,". *Journal of Microelectromechanical Systems*, 25:1 pp. 69-77 (2016).

Kagan et al., "Building devices from colloidal quantum dots," *Science*, 353:6302, pp. 1-11 (2016).

Kairdolf et al., "Semiconductor Quantum Dots for Bioimaging and Biodiagnostic Applications," *Annu. Rev. Anal. Chem.* vol. 6, pp. 143-162 (2013).

Keum et al., "Solvent-Free Patterning of Colloidal Quantum Dot Films Utilizing Shape Memory Polymers," *Micromachines*, vol. 8, pp. 1-7, (2017).

Kim et al., "High-Efficiency Cu—In—S Quantum-Dot-Light-Emitting Device Exceeding 7%,". *Chemistry of Materials*, vol. 28, pp. 6329-6335 (2016).

Kim et al., "Contact Printing of Quantum Dot Light-Emitting Devices," *Nano Letters*, 8:12, pp. 4513-4517 (2008).

Kim et al., "Microstructured elastomeric surfaces with reversible adhesion and examples of their use in deterministic assembly by transfer printing," *PNAS*, 107:40 pp. 17095-17100 (2010).

Kim et al., "Full-colour quantum dot displays fabricated by transfer printing,". *Nature Photonics*, vol. 5, pp. 176-182 (2011).

Kim et al., "Heterogeneous stacking of nanodot monolayers by dry pick-and-place transfer and its applications in quantum dot light-emitting diodes," *Nature Communications*, 4:2637, pp. 1-12 (2013).

Kwak et al., "Bright and Efficient Full-Color Colloidal Quantum Dot Light-Emitting Diodes Using an Inverted Device Structure," *Nano Letters*, vol. 12, pp. 2362-2366 (2012).

Lan et al., "10.6% Certified Colloidal Quantum Dot Solar Cells via Solvent-Polarity-Engineered Halide Passivation," *Nano Letters*, vol. 16, pp. 4630-4634.(2016).

Lim et al., "Influence of Shell Thickness on the Performance of Light-Emitting Devices Based on $CdSe/Zn_{1-x}Cd_xS$ Core/Shell Heterostructured Quantum Dots," *Advanced Materials*, vol. 26, pp. 8034-8040 (2014).

Lim et al., "Highly Efficient Cadmium-Free Quantum Dot Light-Emitting Diodes Enabled by the Direct Formation of Excitons within InP@ZnSeS Quantum Dots," *ACS Nano*, 7:10, pp. 9019-9026 (2013).

Long et al., Modeling the soft backing layer thickness effect on adhesion of elastic microfiber arrays. *J. Appl. Phys.*, vol. 104, pp. 1-10 (2008).

Meitl et al., "Transfer printing by kinetic control of adhesion to an elastomeric stamp," *Nature Materials*, vol. 5, pp. 33-38 (2006).

Nam et al., "High Efficiency and Optical Anisotropy in Double-Heterojunction Nanorod Light-Emitting Diodes," *ACS Nano*, 9:1, pp. 878-885 (2015).

Oh et al., Double-heterojunction nanorod light-responsive leds for display applications. *Science*, vol. 355, pp. 616-619 (2017).

Oh et al., N.; Nam, S.; Zhai, Y.; Deshpande, K.; Trefonas, P.; Shim, M. Double-heterojunction nanorods, *Nature Communications*, 5:3642, pp. 1-8 (2014).

Park et al., "Alternative Patterning Process for Realization of Large-Area, Full-Color, Active Quantum Dot Display," *Nano Letters*, vol. 16, pp. 6946-6953 (2016).

Pietryga et al., "Spectroscopic and Device Aspects of Nanocrystal Quantum Dots," *Chemical Reviews*, vol. 116, pp. 10513-10622 (2016).

Rizzo et al., "Hybrid Light-Emitting Diodes from Microcontact-Printing Double-Transfer of Colloidal Semiconductor CdSe/ZnS Quantum Dots onto Organic Layers," *Advanced Materials*, vol. 20, pp. 1886-1891 (2008).

Smyder et al., "Coming Attractions for Semiconductor Quantum Dots," *Materials Today*, 14:9, pp. 382-387 (2011).

Wang et al., "Direct optical lithography of functional inorganic nanomaterials," *Science*, vol. 357, pp. 385-388 (2017).

Yang et al., "High-efficiency light-emitting devices based on quantum dots with tailored nanostructures," *Nature Photonics*, vol. 9, pp. 259-266 (2015).

Yeom et al., "Detachment Lithography of Photosensitive Polymers: A Route to Fabricating Three-Dimensional Structures," *Advanced Functional Materials*, vol. 20, pp. 289-295 (2010).

\* cited by examiner

160 bringing a patterning stamp in contact with a layer of quantum dots disposed on a substrate, the patterning stamp comprising a patterned photoresist layer disposed on an elastomer layer, such that a portion of the quantum dots in contact with the patterned photoresist layer adheres to the patterning stamp, the portion of the quantum dots being adhered quantum dots        161 peeling the patterning stamp from the substrate with a peeling speed larger than a pre-determined peeling speed to remove the adhered quantum dots from the substrate, wherein a remaining portion of the quantum dots forms a patterned quantum dot layer on the substrate
162

FIG. 1B

560 bringing a patterning stamp in contact with a layer of quantum dots disposed on a substrate, the patterning stamp comprising a patterned photoresist layer disposed on an elastomer layer, such that a portion of the quantum dots in contact with the patterned photoresist layer adheres to the patterning stamp, the portion of the quantum dots being adhered quantum dots;   561 peeling the elastomer layer of the patterning stamp from the substrate with a peeling speed larger than a pre-determined peeling speed smaller than a pre-determined peeling speed, so that the patterned photoresist layer of the patterning stamp remains on the layer of quantum dots on the substrate;   562 depositing a layer of a second material on the patterned photoresist layer and the layer of quantum dots;   563 removing the patterned photoresist layer from the substrate with a pressure sensitive adhesive (PSA) layer to remove the adhered quantum dots, such that a remaining portion of quantum dots forms a patterned quantum dot layer capped with the layer of the second material   564

FIG. 5B

PHOTORESIST CONTACT PATTERNING OF QUANTUM DOT FILMS

RELATED APPLICATION

This application claims priority to Provisional Application No. 62/732,195, filed on Sep. 17, 2018, which is incorporated by reference in its entirety.

STATEMENT REGARDING FEDERALLY SPONSORED RESEARCH OR DEVELOPMENT

This invention was made with government support under CMMI-1351370 awarded by the National Science Foundation. The government has certain rights in the invention.

BACKGROUND

Recent progress in nanoscale materials is paving the path to a variety of advanced applications ranging from biomedical diagnostics and solar energy conversion to lighting and displays. Colloidal quantum dots (QDs) or semiconductor nanocrystals are a class of nanoscale materials appealing for use in these applications due to their properties that may be tuned through size, shape and composition. For example, in addition to size-dependent photoluminescence emission wavelengths, rod-shaped colloidal nanocrystals may provide benefits of directionality/anisotropy. Furthermore, introduction of well-defined heterojunctions into anisotropic nanocrystals enables nanoscale precision in band structure engineering that may lead to new opportunities for next-generation devices with multiple functionality.

Colloidal QDs may allow cost-effective approaches to manufacturing through simple solution processes rather than costly vacuum techniques. While beneficial in many ways, the solubility of QDs may be a hindrance, especially when delicate QD patterns are required within device structures. For example, spin-cast thin films of QDs are in general not compatible with conventional photolithography because QD films may be dissolved away in solvents used with photoresists. Similarly, solvents used for QDs may damage patterned photoresists.

The present disclosure describes methods for creating a patterned quantum dot layer, which address at least one or more drawbacks discussed above.

BRIEF SUMMARY

The present disclosure is directed to a method for creating a patterned quantum dot layer. The method includes bringing a patterning stamp in contact with a layer of quantum dots disposed on a substrate, the patterning stamp comprising a patterned photoresist layer disposed on an elastomer layer, such that a portion of the quantum dots in contact with the patterned photoresist layer adheres to the patterning stamp, the portion of the quantum dots being adhered quantum dots. The method also includes peeling the patterning stamp from the substrate with a peeling speed larger than a pre-determined peeling speed to remove the adhered quantum dots from the substrate. A remaining portion of the quantum dots forms a patterned quantum dot layer on the substrate.

The present disclosure also describes another method for creating a patterned quantum dot layer. The method includes bringing a patterning stamp in contact with a layer of quantum dots disposed on a substrate, the patterning stamp comprising a patterned photoresist layer disposed on an elastomer layer, such that a portion of the quantum dots in contact with the patterned photoresist layer adheres to the patterning stamp, the portion of the quantum dots being adhered quantum dots. The method includes peeling the elastomer layer of the patterning stamp from the substrate with a peeling speed smaller than a pre-determined peeling speed, such that the patterned photoresist layer is released from the patterning stamp and remains on the layer of quantum dots on the substrate. The method includes depositing a layer of a second material on the patterned photoresist layer and the layer of quantum dots; and removing the patterned photoresist layer from the substrate with a pressure sensitive adhesive (PSA) layer to remove the adhered quantum dots, such that a remaining portion of quantum dots forms a patterned quantum dot layer capped with the layer of the second material.

BRIEF DESCRIPTION OF THE DRAWINGS

The patent or application file contains at least one drawing executed in color. Copies of this patent or patent application publication with color drawing(s) will be provided by the Office upon request and payment of the necessary fee.

The features, objects and advantages other than those set forth above will become more readily apparent when consideration is given to the detailed description below. Such detailed description makes reference to the following drawings, wherein:

FIG. 1B is a flow diagram for a method for PR contact pattering of a QD film on an ODTS coated Si substrate.

FIG. 5B is a flow diagram of a method for fabricating a patterned QD and metal composite layer and resulting images.

Figure 1A:
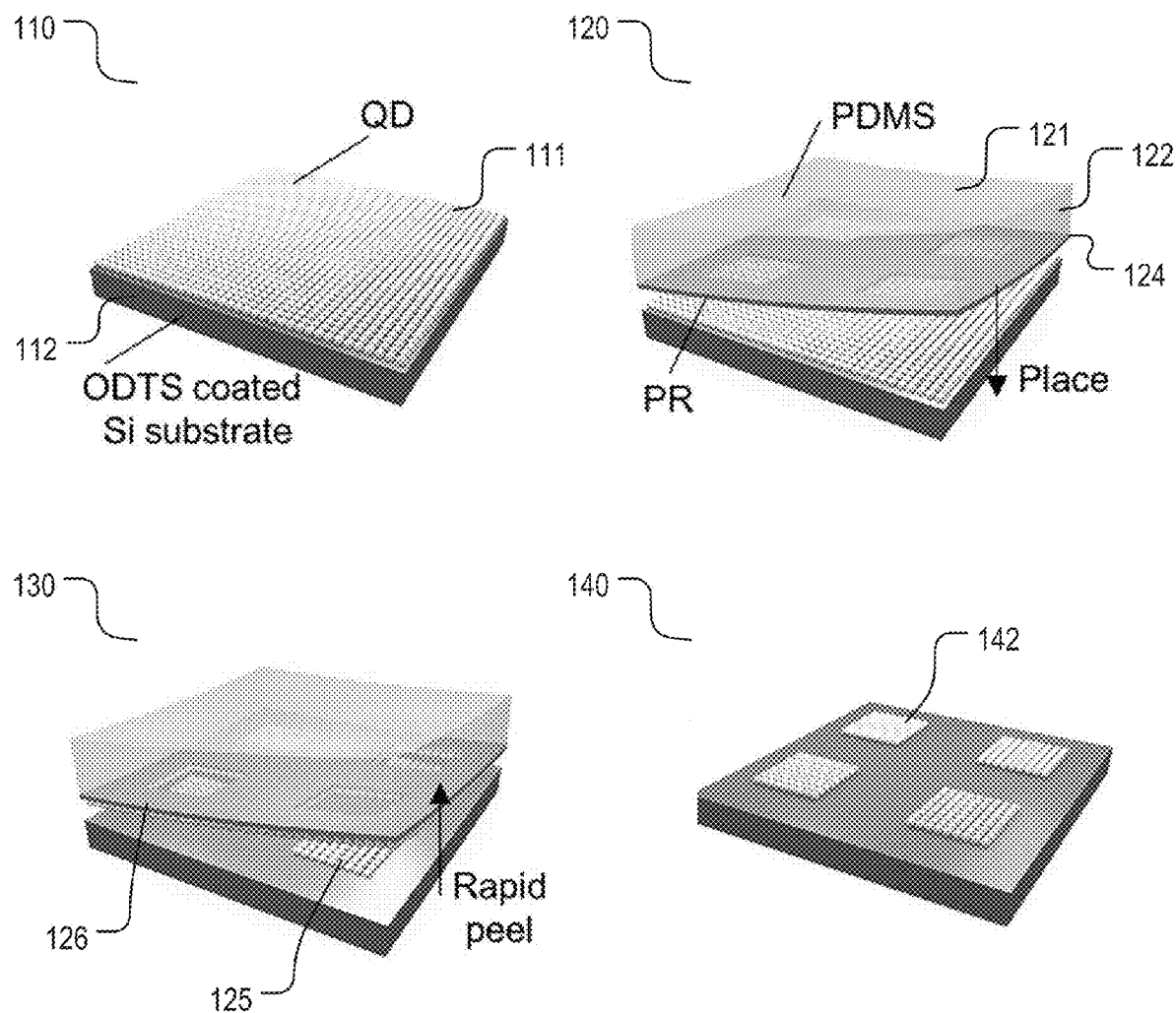
FIG. 1A is a schematic process flow for a method for PR contact pattering of a QD film on an ODTS coated Si substrate. A QD film is spin-cast on an ODTS coated Si substrate. The separately prepared PR stamp, i.e., a PR layer patterned on a PDMS substrate, is brought into contact with the QD film. Subsequent peeling of the PR stamp results in a patterned QD film on the Si substrate. The patterned QD film on the Si substrate.

While the present invention is susceptible to various modifications and alternative forms, exemplary embodiments thereof are shown by way of example in the drawings and are herein described in detail. It should be understood, however, that the description of exemplary embodiments is not intended to limit the invention to the particular forms disclosed, but on the contrary, the intention is to cover all modifications, equivalents and alternatives falling within the spirit and scope of the invention as defined by the embodiments above and the claims below. Reference should therefore be made to the embodiments above and claims below for interpreting the scope of the invention.

DETAILED DESCRIPTION

The device and methods now will be described more fully hereinafter with reference to the accompanying drawings, in which some, but not all embodiments of the invention are shown. Indeed, the invention may be embodied in many different forms and should not be construed as limited to the embodiments set forth herein; rather, these embodiments are provided so that this disclosure will satisfy applicable legal requirements.

Likewise, many modifications and other embodiments of the device and methods described herein will come to mind to one of skill in the art to which the invention pertains having the benefit of the teachings presented in the foregoing descriptions and the associated drawings. Therefore, it is to be understood that the invention is not to be limited to the specific embodiments disclosed and that modifications and other embodiments are intended to be included within the scope of the appended claims. Although specific terms are employed herein, they are used in a generic and descriptive sense only and not for purposes of limitation.

Throughout the specification and claims, terms may have nuanced meanings suggested or implied in context beyond an explicitly stated meaning. Likewise, the phrase "in one embodiment" or "in one implementation" as used herein does not necessarily refer to the same embodiment or implementation and the phrase "in another embodiment" or "in another implementation" as used herein does not necessarily refer to a different embodiment or implementation. It is intended, for example, that claimed subject matter includes combinations of exemplary embodiments or implementations in whole or in part.

In general, terminology may be understood at least in part from usage in context. For example, terms, such as "and", "or", or "and/or," as used herein may include a variety of meanings that may depend at least in part upon the context in which such terms are used. Typically, "or" if used to associate a list, such as A, B or C, is intended to mean A, B, and C, here used in the inclusive sense, as well as A, B or C, here used in the exclusive sense. In addition, the term "one or more" or "at least one" as used herein, depending at least in part upon context, may be used to describe any feature, structure, or characteristic in a singular sense or may be used to describe combinations of features, structures or characteristics in a plural sense. Similarly, terms, such as "a", "an", or "the", again, may be understood to convey a singular usage or to convey a plural usage, depending at least in part upon context. In addition, the term "based on" or "determined by" may be understood as not necessarily intended to convey an exclusive set of factors and may, instead, allow for existence of additional factors not necessarily expressly described, again, depending at least in part on context.

Unless defined otherwise, all technical and scientific terms used herein have the same meaning as commonly understood by one of skill in the art to which the invention pertains. Although any methods and materials similar to or equivalent to those described herein may be used in the practice or testing of the present invention, the preferred methods and materials are described herein.

Colloidal quantum dots (QDs) or semiconductor nanocrystals are a class of nanoscale materials appealing for use in these applications due to their properties that may be tuned through size, shape and composition. Colloidal QDs may allow cost-effective approaches to manufacturing through simple solution processes rather than costly vacuum techniques. While beneficial in many ways, the solubility of QDs may be a hindrance, especially when delicate QD patterns are required within device structures. For example, spin-cast thin films of QDs are in general not compatible with conventional photolithography because QD films may be dissolved away in solvents used with photoresists. Similarly, solvents used for QDs may damage patterned photoresists.

In one implementation, one solution to the existing problems may be to modify the surface of QDs to achieve orthogonality to the solvents used for photolithography. For instance, QDs with ionized hydrophilic surfaces may be assembled layer-by-layer into a film that may survive the photolithography processes. In another implementation, direct optical lithography of QDs may be incorporating photoactive ionic molecules as ligands for the QDs. However, many state-of-the-art colloidal QD-based optoelectronic devices may require organic charge transport layers, which may be damaged by the conventional photolithography processes.

In another implementation, one approach to solve the above drawbacks may be to allow patterning of QD films with resolution as high as photolithography and also to permit integration of QD-based devices without damaging device components.

In another implementation, contact and transfer printing method may be among alternative approaches to pattern and integrate QD films within functional device structures. Contact printing is a method where QDs deposited on a structured polydimethysiloxane (PDMS) stamp coated with parylene-C are subsequently brought into contact with a receiving substrate, resulting in printing of QDs that are on the protruding regions of the stamp.

Contact printing may have the benefits of the simplicity and high throughput. Existing contact printing may be limited due to the inking step that requires a solvent compatible with both parylene-C and QDs. In one implementation, this limitation may be resolved by using dry transfer printing techniques. Rather than spin-casting directly onto a structured PDMS stamp, QDs spin-cast and dried on a donor substrate may be selectively picked up via a stamp and the retrieved QDs may be subsequently printed onto target sites on a receiving substrate. This transfer printing method may be used in fabricating large area flexible QD-LED displays. More detailed description related to contact printing is included in U.S. application Ser. No. 16/024,123, filed on Jun. 29, 2018 by the same Applicant as the present application, which is incorporated herein by reference in its entirety.

Transfer printing of QDs may include the introduction of a poly(vinyl alcohol) layer to enhance retrieval of QD films and/or an intaglio patterning step to push the patterning resolution limit well beyond current needs for most applications. However, the existing methods of transfer printing of QDs may rely on the rate-dependent adhesion of PDMS, often requiring a high preload with a high peeling speed, or expensive intaglio trenches. In one implementation, a shape memory polymer (SMP) may be utilized in place of PDMS as a stamp material to pattern QD films. An SMP stamp may allow reliable patterning of QDs even with a low peeling speed since it exploits the shape memory effect to switch its dry adhesion rather than the peeling rate. The SMP stamp may need thermo-mechanical loading to enable the shape memory effect, which may affect the process throughput. More detailed description related to transfer printing is included in U.S. application Ser. No. 15/657,487, filed on Jul. 24, 2017 by the same Applicant as the present application, which is incorporated herein by reference in its entirety.

The present disclosure provides an embodiment of a method for creating a patterned quantum dot layer. The method may use a dry means by exploring the use of a photolithographically patterned photoresist (PR) layer to achieve creating patterned QD films over large areas with high resolution. This method may refer as 'PR contact patterning'. A patterned PR layer on an elastomer substrate, i.e., a PR stamp, may be brought into contact with a film of QDs. The subsequent peeling of the PR stamp may remove the QDs that are in contact with the PR stamp, thereby forming a pattern on the QD film that is the negative of the photolithographically defined pattern on the PR stamp. In one implementation, the PR stamp may refer as "patterning stamp."

This PR contact patterning may have several major advantages over other dry approaches to patterning QD films. First, the pattern resolution of PR contact patterning depends on that of a PR stamp that is photolithographically defined, and thus the pattern resolution of PR contact patterning is inherently high. In another implementation, the pattern design may also be generated directly on a PR stamp using photolithography instead of molding processes which may require fabricating different master templates for different pattern designs, impairing versatility and cost-savings.

Once different QD films are patterned by PR contact patterning, they may be transfer printed on a common receiving substrate, allowing, for example, vertical stacking or horizontal arrays of different QD films. Furthermore, a PR layer on an elastomer substrate may also be transferred onto a QD film (referred to hereon as 'PR contact transfer'), and additional layers such as metal thin films for electrical contacts may be deposited on the entire area. Subsequent peeling of the PR layer allows multiple stacks of heterogeneous materials to be patterned simultaneously. Such abilities of PR contact patterning enable the scalable fabrication of QD-based electronic or optoelectronic devices, in particular, when combined with transfer printing.

The present disclosure describes an embodiment of a method of patterning colloidal QD thin films using a photolithographically patterned PR, termed "PR contact patterning." The method may include one or more purely dry and non-detrimental process to QDs, and may conveniently enable high-resolution patterning over large areas. The patterned QD films may also be transfer printed onto virtually any foreign surface for utilization. In addition to PR contact patterning, the method may optionally further include 'PR contact transfer' wherein a patterned PR may be transferred directly onto a QD film and used as a masking layer for subsequent fabrication steps/processes. The PR contact transfer approach may allow additional materials to be deposited prior to removal of the transferred PR, providing a very simple means of vertically stacking multiple layers of various compositions on top of QD films with the same pattern design. In one embodiment, red-green-blue (RGB) pixels of QD-light-emitting diodes (QD-LEDs) may be fabricated on the same substrate using the above described method. The patterning capabilities may enable a scalable and cost-effective approach to heterogeneous integration of QD films with other materials such as charge transport layers and metal electrodes on separately optimized substrates, facilitating manufacturing of advanced QD-based devices.

FIG. 1A represents a process flow of a method for creating a patterned quantum dot layer using PR contact patterning. In step 110, the method includes spin-casting a solution of quantum dots on a substrate 112 to form a layer of quantum dots 111. The quantum dots 111 may include colloidal QDs which are cleaned and dissolved in octane. The substrate may include a silicon substrate. In one implementation, the substrate may include an octadecyltrichlorosilane (ODTS) coated Si substrate.

Figure 8:
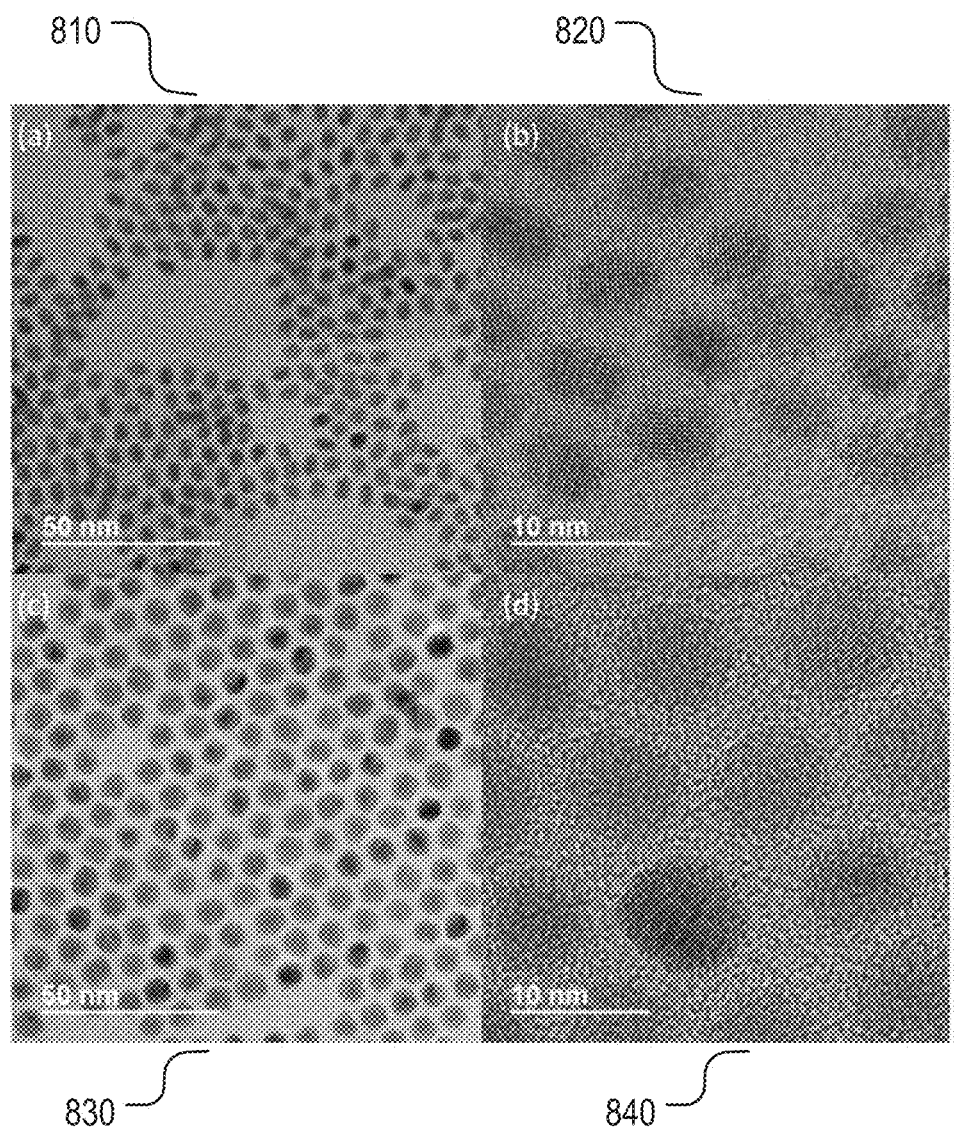
FIG. 8 is transmission electron microscopy (TEM) image of red QDs core, its magnified image, TEM image of red QDs core/shell, and its magnified image.
Figure 9:
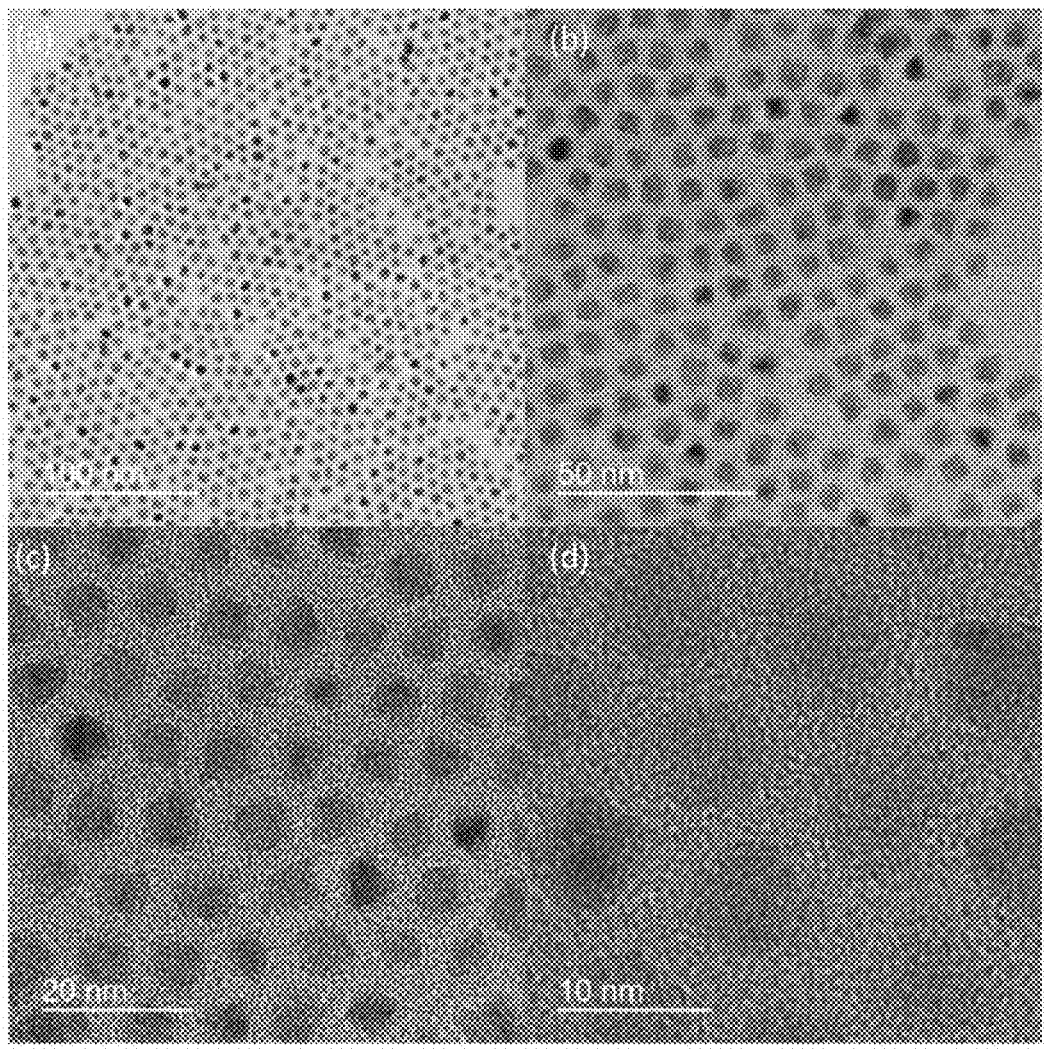
FIG. 9 is TEM images of green QDs at different magnifications.
Figure 10:
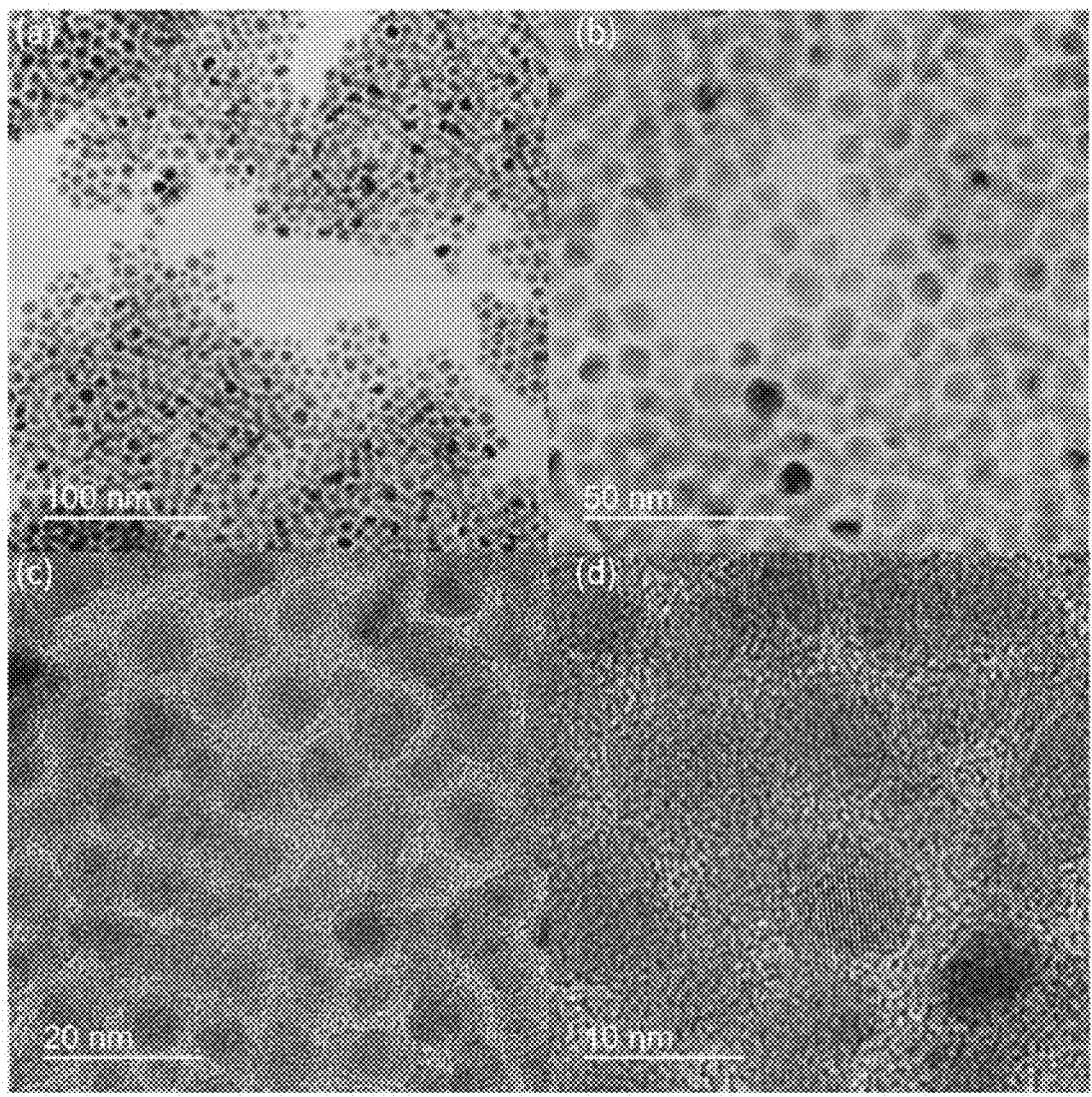
FIG. 10 is TEM images of blue QDs at different magnifications.

FIGS. 8-10 show transmission electron microscopy (TEM) images of QDs with different color. FIG. 8 shows TEM images of red QD core 810 and its magnified image 820 and TEM image of red QD core/shell 830 and its magnified image 840. FIG. 9 shows TEM images of green QD at different magnifications. FIG. 10 shows TEM images of blue QD at different magnifications.

In step 120, the method may include bringing a patterning stamp 121 in contact with the layer of quantum dots disposed on the substrate. The patterning stamp 121 may include a patterned photoresist (PR) layer 124 disposed on an elastomer layer 122. When the pattering stamp 121 is placed on the layer of quantum dots, a portion of the quantum dots 126 that is in contact with the patterned photoresist layer may adhere to the patterned photoresist layer 124 of the patterning stamp 121. The portion of the quantum dots 126 may be refereed as "adhered quantum dots."

In one implementation, the elastomer layer 122 may include a PDMS substrate. The PR layer is spin-cast and photolithographically patterned on a PDMS substrate to form the patterning stamp 121. The patterning stamp is then brought into contact with the QD film on the ODTS coated Si substrate at about 65° C. with the patterned PR layer facing the QD film. The elevated temperature and a slight preload enhance the conformal contact between the pattering stamp and the QD film. The patterning stamp may be referred as "PR stamp." Here, "about" a value may mean a range between 90% and 110% of the value, inclusive.

In step 130, the method includes peeling the patterning stamp from the substrate with a peeling speed larger than a pre-determined peeling speed to remove the adhered quantum dots from the substrate. Upon cooling down to room temperature and quickly peeling the PR stamp, regions of the adhered quantum dots 126 that are in contact with the PR stamp are removed. The pre-determined speed may be fast enough to peel the adhered quantum dots 126, the patterned photoresist layer 124, and the elastomer layer 122 together. In one implementation, the pre-determined peeling speed may be about 1 cm/sec. The room temperature may refer to a temperature within a range between 20° C. and 30° C., inclusive. Here and in the present disclosure, "about" a value may mean a range between 90% and 110% of the value, inclusive.

Referring to 140 in FIG. 1A, after the patterning stamp 121 with the adhered quantum dots 126 are peeled away from the substrate 112, a remaining portion of the quantum dots may form a patterned quantum dot layer 142 on the substrate 112. The remaining portion of the quantum dots may be the QDs in openings 125 of the patterned photoresist layer 124. This process leaves behind a high-resolution patterned quantum dot layer, which corresponds to the lithographically defined pattern of the patterned photoresist layer 124.

FIG. 1B shows a flow diagram of an embodiment of a method for creating a patterned quantum dot layer. The method 160 includes step 161: bringing a patterning stamp in contact with a layer of quantum dots disposed on a substrate, the patterning stamp comprising a patterned photoresist layer disposed on an elastomer layer, such that a portion of the quantum dots in contact with the patterned photoresist layer adheres to the patterning stamp, the portion of the quantum dots being adhered quantum dots; and step 162: peeling the patterning stamp from the substrate with a peeling speed larger than a pre-determined peeling speed to remove the adhered quantum dots from the substrate, wherein a remaining portion of the quantum dots forms a patterned quantum dot layer on the substrate.

Figure 1C:
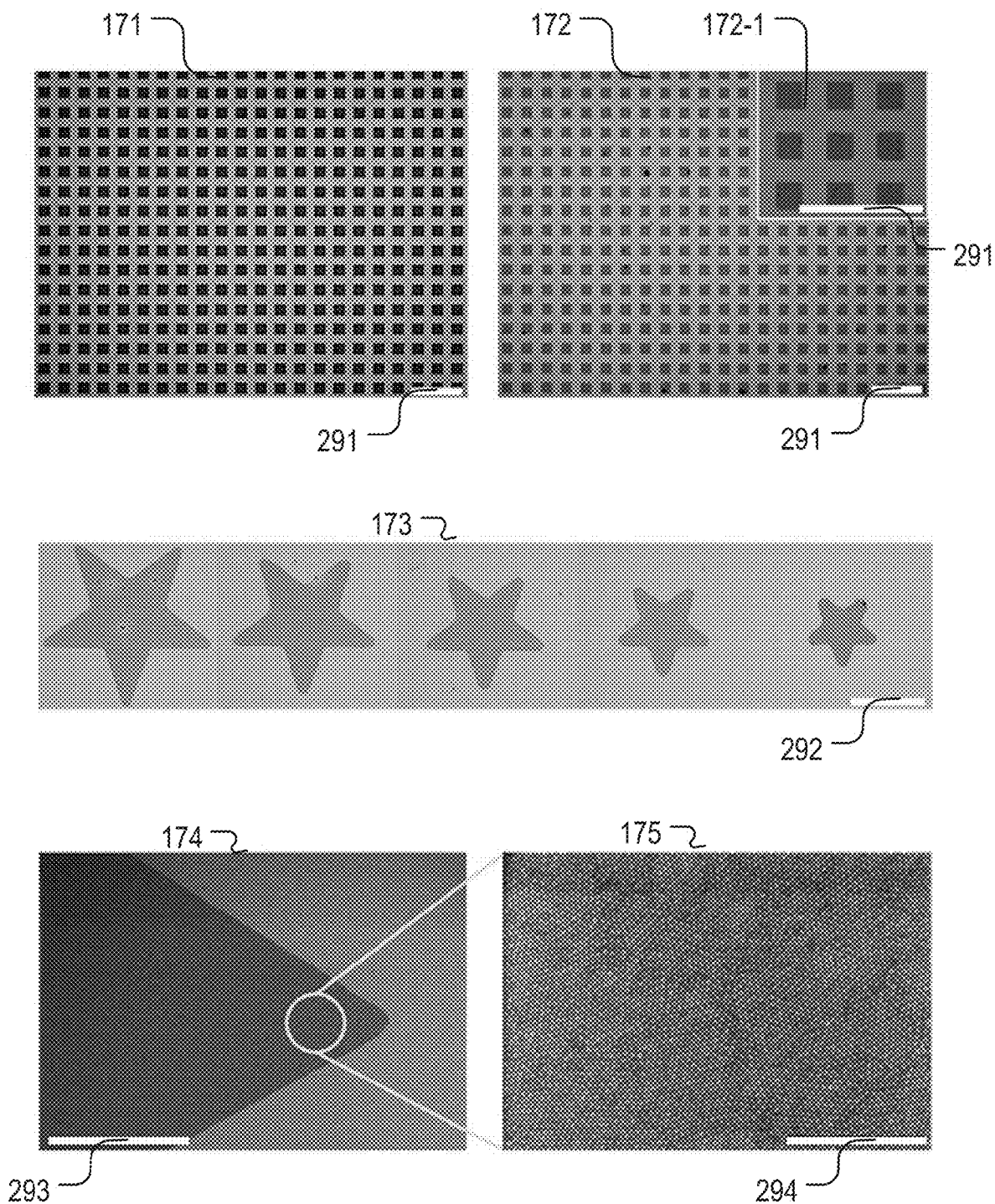
FIG. 1C is images for PR contact pattering of a QD film on an ODTS coated Si substrate. An optical microscope image of a PR layer photolithography patterned on a PDMS substrate. An optical microscope image of a patterned QD film on a Si substrate after PR contact patterning. The inset includes a magnified image that shows clear patterns of individual QD squares. Optical microscope images of complex star shape QD patterns with different sizes. SEM images of a corner of a triangle shape QD pattern in two different magnifications. The right image shows compactly remaining QDs in the pattern region.

FIG. 1C shows some examples of QD films patterned on ODTS coated Si substrates through PR contact patterning. In one implementation, a grid-pattern PR layer on a PDMS substrate 171 is created and the corresponding patterned array of QD squares on a Si substrate 172 is created. 171 and 172 are optical images. The inset 172-1 is a magnified image showing no significant residue in regions where the QDs may be in direct contact with the PR stamp and peeled off. For example, the individual QD squares may be 12 μm×12 μm over a 2.5 cm×2.5 cm area, which demonstrates the feasibility of large-area, high-resolution patterning of QD films through PR contact patterning. In another implementation, higher precision with a smaller feature size may be achieved so as to increase the patterning resolution to submicron level. Scale bars 291 may represent 50 μm. Scale bars 292 may represent 150 μm. Scale bars 293 may represent 100 μm. Scale bars 294 may represent 200 nm.

In another implementation, FIG. 1C shows patterning of complex star shape QD films with various dimensions 173.

In another implementation, FIG. 1C shows that images 174 and 175 of scanning electron microscopy reveals that densely packed QDs may be easily patterned into complex shapes without any discernable damage.

Figure 2A:
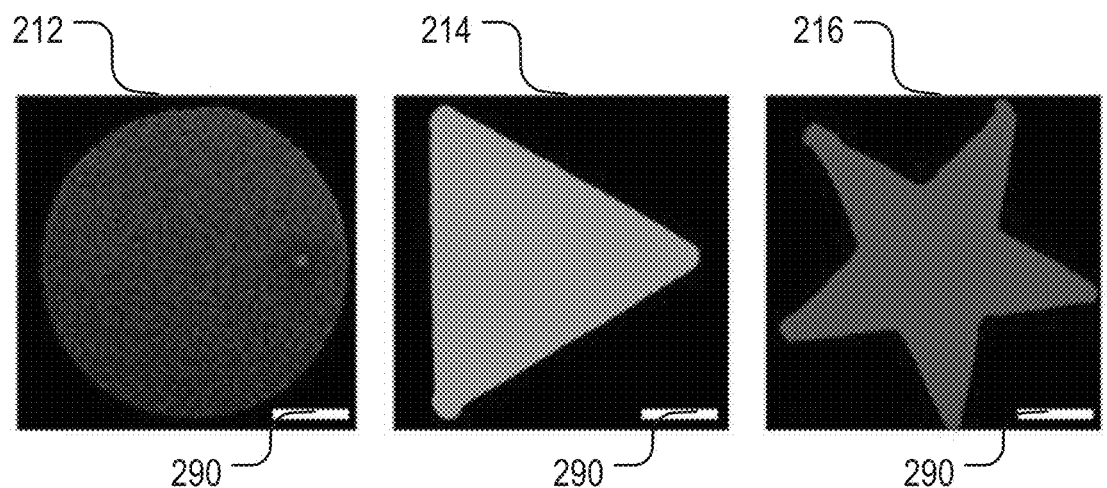
FIGS. 2A-2C show photoluminescence (PL) images of patterned QD films on ODTS coated Si substrates, including red, green, and blue (RGB) QD films patterned in circle, triangle, and star shapes; RGB QD square arrays; and red QD film patterned into 'UIUC'.
Figure 2B:
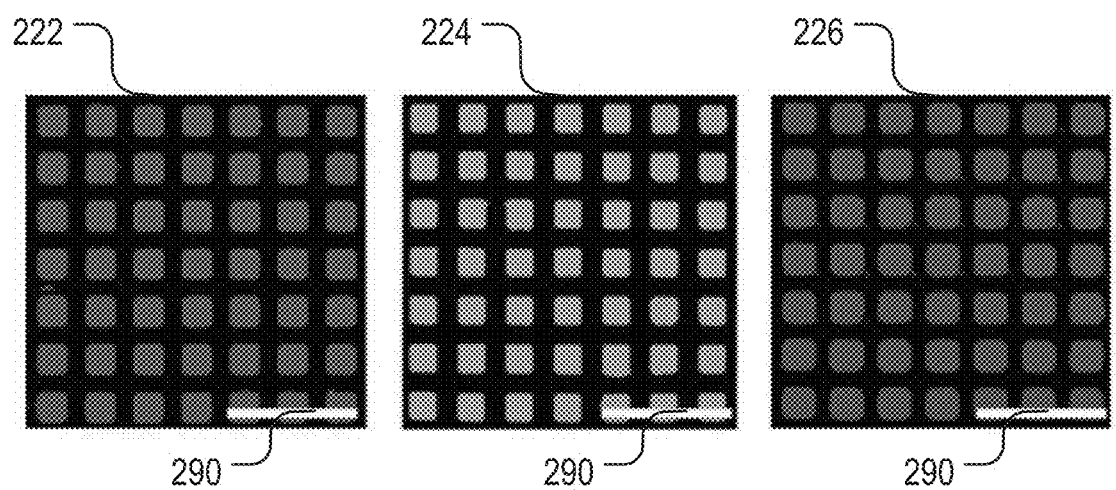
Figure 2C:
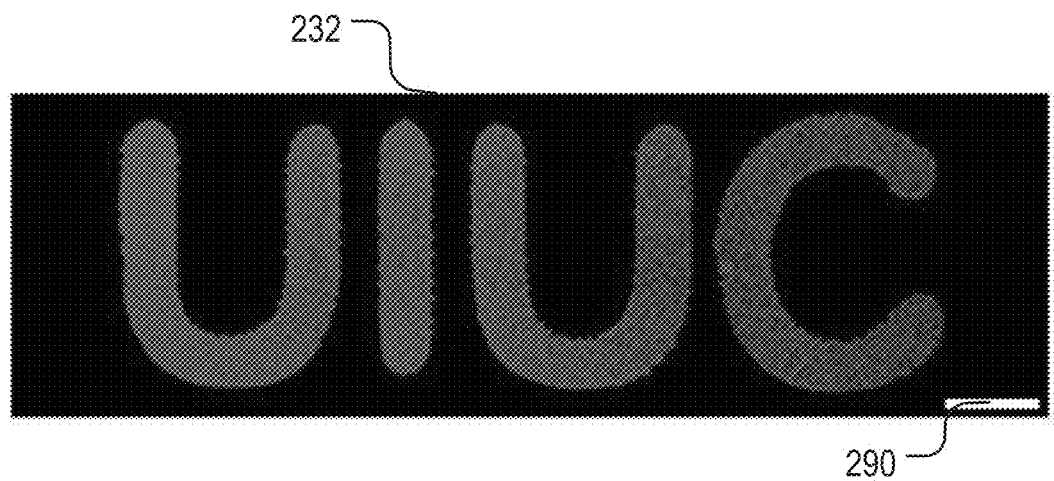
Figure 2D:
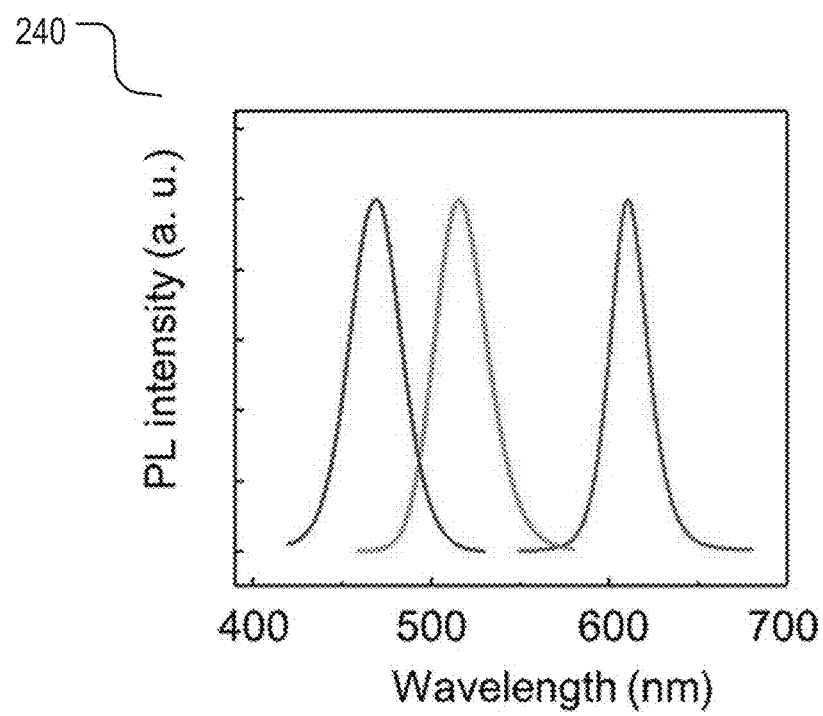
FIG. 2D shows PL spectra of patterned RGB QD films.

FIGS. 2A-2C shows a high quality patterning capability of PR contact patterning for diverse QD materials, red, green, and blue (RGB) QD films. Photoluminescence (PL) images of QD patterns may be collected with a confocal microscope with a 405 nm laser excitation source using band pass range ±10 nm of the PL peak positions, including 616 nm, 516 nm, 470 nm for RGB QDs, respectively. Scale bars 290 may represent 50 μm.

FIG. 2A shows RGB QD films in circle 212, triangle 214, and star shapes 216, respectively. FIG. 2B shows square arrays of RGB QD patterns, which shows the scalability of PR contact patterning, including red QD pattern 222, a green QD pattern 224, and a blue QD pattern 226. FIG. 2C shows complex features including the letters 'UIUC' 232, which may be easily replicated on a QD film. FIG. 4D shows PL spectra 240 of patterned QD films, including the narrow full-width-at-half-maximum (FWHM) of only ~30 nm may be maintained for all cases. The unchanged PL spectral features and brightness of QD films before and after patterning indicate that PR contact patterning does not alter the PL properties of QD films.

Figure 3A:
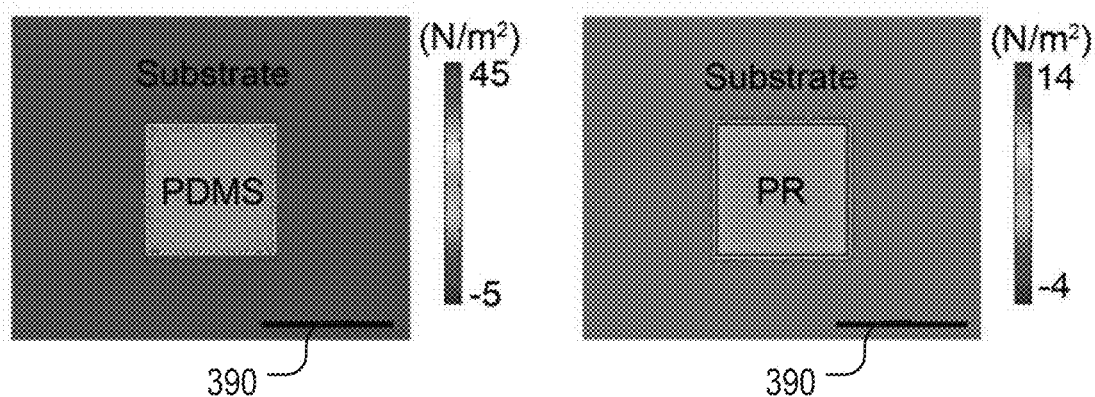
FIGS. 3A and 3B show finite element analysis (FEA) fringe plots of a normal stress distribution near the contact interface between a Si substrate and either PDMS or PR stamp when 10 N/m² tensile pressure is applied on the top surface of each stamp. Both top view and side view results indicate that a PR stamp involves lower stress concentration at the edge and less stress variation along the contact interface. Note that color scale range for the stress is different for PDMS and PR. The scale bars represent 100 µm.
Figure 3B:
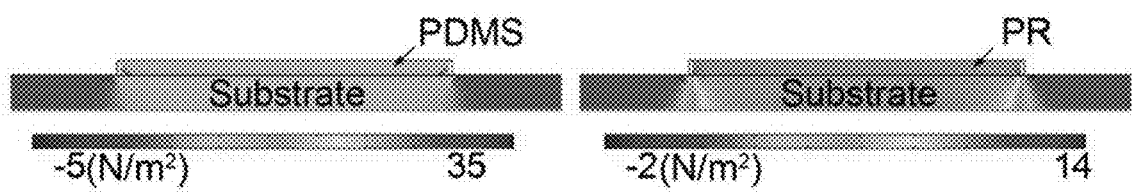

FIGS. 3A and 3B show normal stresses at the contact interface between the stamp (PDMS or PR) and the substrate (Si) using finite element analysis (FEA), which may be used to understand this simple-yet-effective QD film patterning capability of PR contact patterning. In FIGS. 3A and 3B, a top surface of the stamp is pulled with 10 N/m². FIG. 3A includes the top view and FIG. 3B includes the side view of normal stress fringe plots, which indicates that the stress distribution at the PR-Si contact interface may be more uniform than the PDMS-Si contact interface due to the higher Young's modulus of PR (2 GPa). Scale bars 390 may represent 100 μm.

More uniform interfacial stress distribution leads to lower local stresses at the contact edges and thus, a higher pull-off force which enhances the resolution of patterned QD films on Si substrates. This observation may be consistent with the concept of equal load sharing. When a stamp with the same work of adhesion is more rigid than the other, the load may be more equally shared along the contact interface when the stamp is pulled from a substrate. This may mean that local loads at the contact edge and the contact center are less different. In other words, there may be a higher tendency for contact edge and contact center regions to fail simultaneously and thus, a higher pull-off force is expected when the stamp is peeled from the substrate.

In one implementation, the work of adhesion between different surfaces involved in PR contact patterning may be calculated from experimentally measured contact angle data in order to further understand PR contact patterning.

Figure 3C:
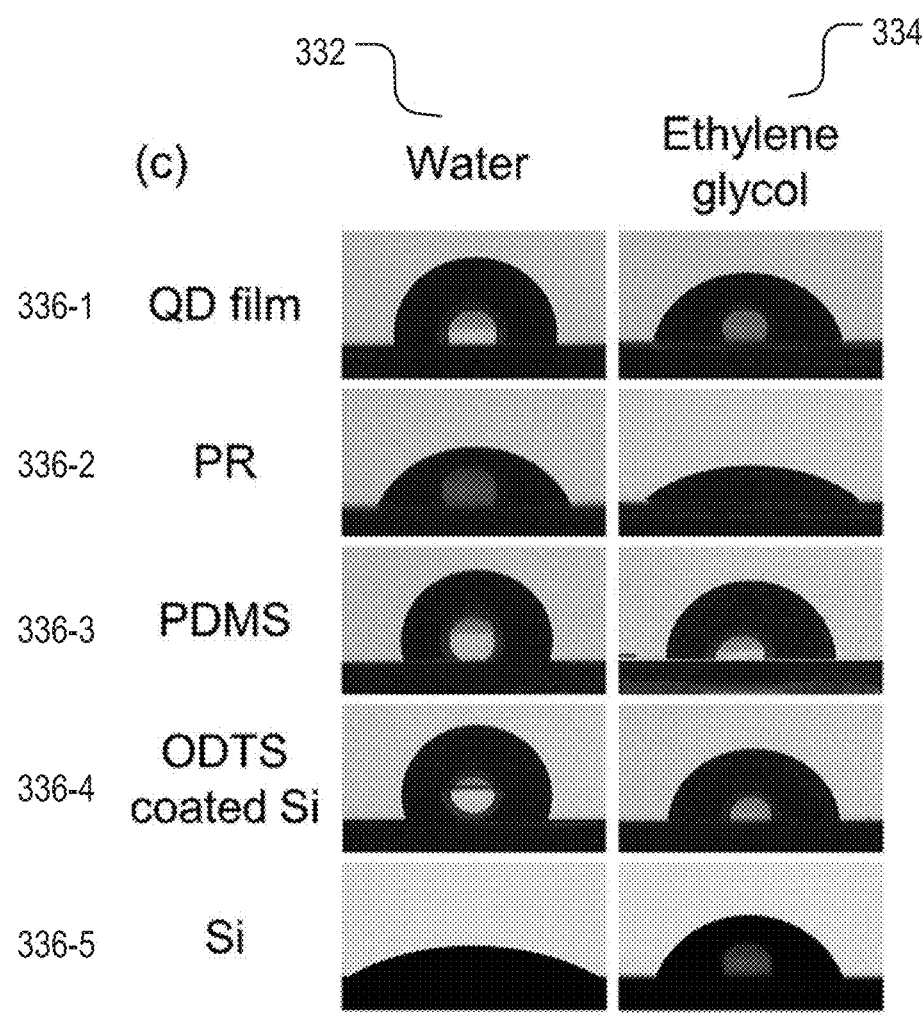
FIG. 3C shows images of water and ethylene glycol droplets on QD film, PR, PDMS, ODTS coated Si, and Si surfaces.

Referring to FIG. 3C, deionized (DI) water 332 and ethylene glycol droplets (5 µl) 334 are placed on QD film 336-1, PR 336-2, PDMS 336-3, ODTS coated Si 336-4, and bare Si surface 336-5. Their contact angles (θ) may be measured and listed in Table 1. DI water and ethylene glycol are selected since both dispersion and polar components of their surface energies are known ($\gamma_{H_2O}^d$=23.9, $\gamma_{H_2O}^p$=48.8, $\gamma_{EG}^d$=29.2, $\gamma_{EG}^p$=18.3 mJ/m$^2$), which may be used to obtain the analogous components of the surface energy of a solid surface using the following equation.

$$\gamma_{liquid}(1 + \cos\theta) = \frac{4\gamma_{solid}^d \gamma_{liquid}^d}{\gamma_{solid}^d + \gamma_{liquid}^d} + \frac{4\gamma_{solid}^p \gamma_{liquid}^p}{\gamma_{solid}^p + \gamma_{liquid}^p} \quad \text{(Equation 1)}$$

where d and p denote the dispersion and polar components of the surface energy, respectively.

The calculated surface energies are listed in Table 2. The work of adhesion between two contacting solid surfaces is then calculated using the harmonic mean equation.

$$W_{12} = \frac{4\gamma_1^d \gamma_2^d}{\gamma_1^d + \gamma_2^d} + \frac{4\gamma_1^p \gamma_2^p}{\gamma_1^p + \gamma_2^p} \quad \text{(Equation 2)}$$

The subscripts 1 and 2 in equation (2) represent the two contacting solid surfaces. Table 3 lists work of adhesion values at two contacting solid interfaces including the QD and Si interface as a point of reference that helps to explain why an ODTS layer is necessary for PR contact patterning. Without an ODTS layer on a Si substrate, a QD film may not be well patterned by the PR stamp due to the high work of adhesion between QDs and Si. It is also shown that the work of adhesion between PR and QDs is around 49% larger than that between PDMS and QDs. This larger work of adhesion between PR and QDs along with more uniform interfacial stresses of the PR stamp as shown in the above FEA results validate that PR is a better choice as the stamp material to improve QD film patterning quality. It should also be noted that the work of adhesion between PR and QD is 19% higher than that between PR and PDMS, indicating that it is possible to transfer a PR layer on a PDMS substrate onto a QD film in certain circumstances. For example, the peeling rate of a PR stamp determines whether the PR layer on a PDMS substrate is transferred on a QD layer or not. High or moderate peeling rate makes the PR layer retrieve QDs. On the other hand, low peeling rate makes the PR layer transferred on the QD layer. In addition to these interfacial conditions, the size of the PR layer openings compared with the PR thickness is critical to successful QD patterning. Too large PR layer opening or too small PR thickness may make the PDMS substrate collapse and touch the QD layer through the PR layer openings, leading to irregular QD patterning.

TABLE 1

Measured contact angles

| Contact angle (°) | QD | PR | PDMS | ODTS | Si |
|---|---|---|---|---|---|
| Ethylene glycol | 78.3 | 37.5 | 87.2 | 86.7 | 30.7 |
| Deionized water | 99.5 | 67.9 | 109.3 | 110.7 | 69.6 |

TABLE 2

Surface energies of relevant surfaces calculated using Equation 1.

| Surface energy mJ/m$^2$ | QD | PR | PDMS | ODTS | Si |
|---|---|---|---|---|---|
| $Y_d$ | 12.03 | 19.52 | 14.02 | 18.23 | 24.76 |
| $Y_p$ | 8.41 | 20.17 | 3.58 | 1.44 | 16.53 |
| Y | 20.44 | 39.69 | 17.6 | 19.67 | 41.29 |

TABLE 3

Work of adhesion calculated using Equation 2

| Material combination | Work of adhesion (mJ/m$^2$) |
|---|---|
| QD-PR | 53.51 |
| QD-PDMS | 35.94 |
| QD-ODTS | 33.91 |
| QD-Si | 54.68 |
| PR-PDMS | 44.80 |

Figure 4:
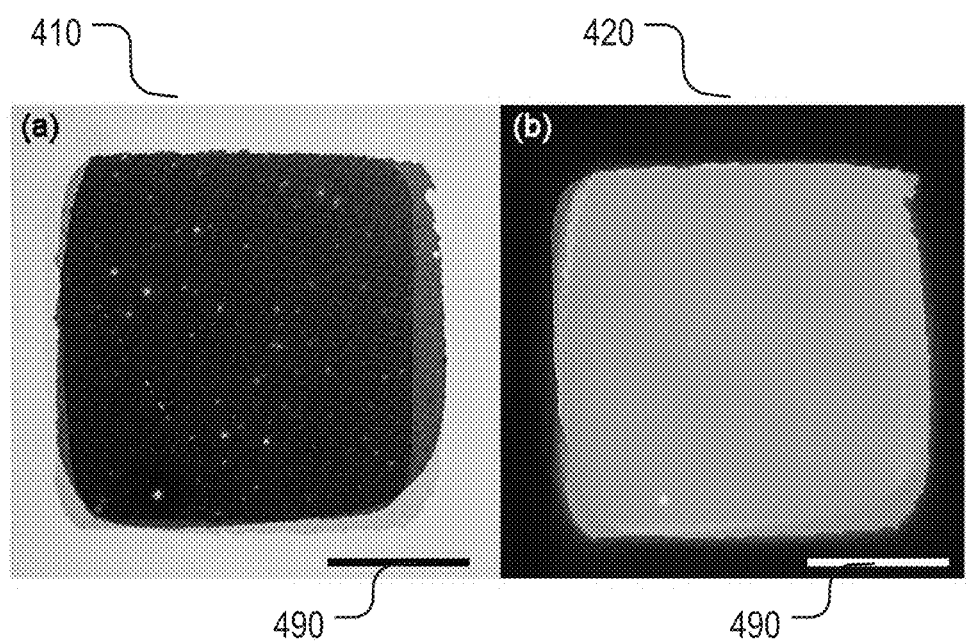
FIG. 4 are images of RGB QD films which are vertically stacked on a glass slide after transfer printing RGB films from different donor substrates using a PDMS stamp. Both optical microscope and photoluminescence images show highly distinct color of each layer. The scale bars represent 50 μm.

Since individually prepared RGB QD films are on low surface energy ODTS coated Si substrates, patterned RGB QD films may be moved to arbitrary substrates using transfer printing. Such an ability may significantly facilitate device integration. In particular, the ability to pattern, position, and stack device-relevant layers together through a dry means would be highly appealing. In one implementation, FIG. 4 shows squares of RGB QD films which may be transfer printed sequentially on a same site of a glass slide using a PDMS stamp. Optical image 410 and PL image 420 of such vertically stacked RGB QD films are shown in FIG. 4. Scale bars 490 may represent 50 µm.

The present disclosure describes another embodiment of a method for creating a patterned quantum dots layer. In this method, in order to develop an approach more relevant to device fabrication, PR contact patterning may be modified to enable PR contact transfer. In this method, the patterned PR layer on the PDMS substrate may be directly transferred onto a QD film prepared on an ODTS coated Si substrate rather than being used only as a stamp to peel off unwanted QDs. The transferred PR layer may then be used as a masking layer for successive material deposition steps. The final peeling of the PR layer using a pressure sensitive adhesive (PSA), i.e., dry lift-off, then leaves behind a patterned QD film/layer with the same pattern of subsequently deposited materials (for example, a metal layer) that are precisely registered to the QD film pattern. To this end, a PSA is gently brought into contact with the deposited layer on the transferred PR layer while taut to ensure that the PSA does not collapse and touch the deposited materials through PR opening.

In one implementation, a relatively flexible PSA is used, for example, an adhesive tape. For the retrieval of PR-metal- QD layer using a pressure sensitive adhesive, when PR is about 4.5 µm thick, up to 500 µm by 500 µm square trench may be created in square patterns.

In another implementation, a relatively rigid and flat adhesive layer may be used, which is not limited by a particular aspect ratio.

In another implementation, the metal layer may include chromium (Cr) and gold (Au) which may be deposited as additional materials.

Figure 5A:
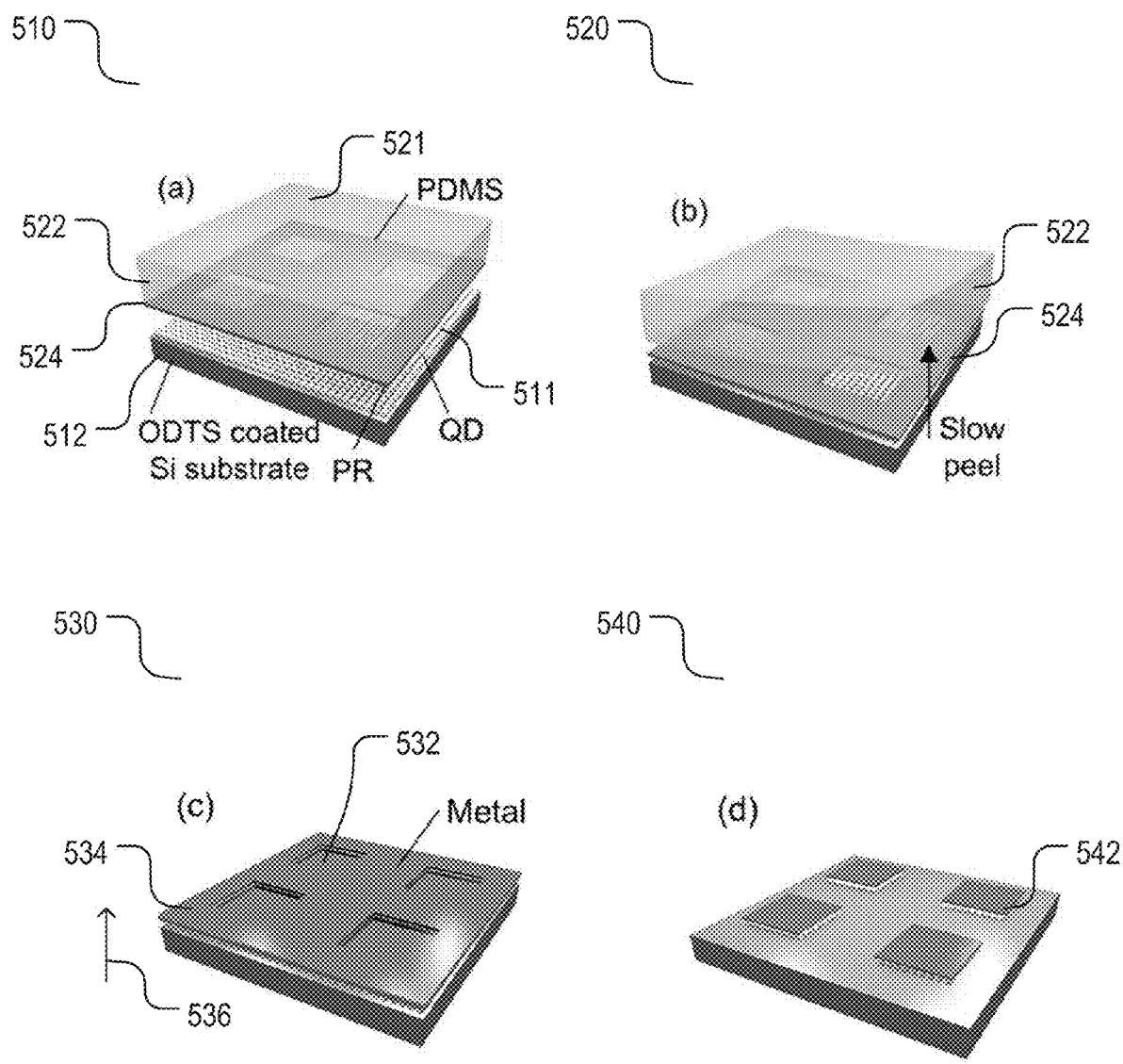
FIG. 5A is a schematic process flow of a method for fabricating a patterned QD and metal composite layer and resulting images. A patterned PR layer is transferred onto a QD film. Metal layers are deposited. Patterned QD/metal squares remain after removing the PR layer.

FIGS. 5A and 5B show another embodiment of a method for creating a patterned quantum dots layer. The method 560 may include step 561: bringing a patterning stamp in contact with a layer of quantum dots disposed on a substrate, the patterning stamp comprising a patterned photoresist layer disposed on an elastomer layer, such that a portion of the quantum dots in contact with the patterned photoresist layer adheres to the patterning stamp, the portion of the quantum dots being adhered quantum dots; step 562: peeling the elastomer layer of the patterning stamp from the substrate with a peeling speed larger than a pre-determined peeling speed smaller than a pre-determined peeling speed, so that the patterned photoresist layer of the patterning stamp remains on the layer of quantum dots on the substrate; step 563: depositing a layer of a second material on the patterned photoresist layer and the layer of quantum dots; and step 564: removing the patterned photoresist layer from the substrate with a pressure sensitive adhesive (PSA) layer to remove the adhered quantum dots, such that a remaining portion of quantum dots forms a patterned quantum dot layer capped with the layer of the second material. In one implementation, the second material may not be limited to metal materials, and may be any other conventional lithographic materials.

Referring to 510 in FIG. 5A, the method may include bringing a patterning stamp 521 in contact with a layer of quantum dots 511 disposed on a substrate 512. The patterning stamp 521 may include a patterned PR masking layer 524 initially on an elastomer layer 522. The elastomer layer may include a PDMS substrate. The patterning stamp may be transferred onto a QD film on an ODTS coated Si substrate. In this transfer, the patterned PR layer may be in contact with a portion of the QD film.

Referring to 520 in FIG. 5A, the PDMS substrate may be peeled slowly at an elevated temperature (about 65° C.). The peeling speed may be smaller than a pre-determined peeling speed, such that the patterned photoresist layer 524 of the patterning stamp remains on the layer of quantum dots on the substrate 512. In one implementation, the pre-determined peeling speed is about 1 mm/sec.

Referring to 530 in FIG. 5A, a layer of a second material may be deposited on the patterned photoresist layer and the layer of quantum dots. The second material may be any pure material or a mixture of materials that may be deposited on QDs and patterned photoresist layer with good adhesion. In one implementation, the second material may include one or more metal materials; and the layer of the second material may include a metal layer. For example and not limited to, 5 nm thick Cr and 100 nm thick Au are sputter-deposited. The metal layer may include at least two different regions. A first region 532 of the metal layer may be directly deposited on the quantum dots, and a second region 534 may be directly deposited on the patterned photoresist layer. The second region 534 may be higher along the direction 536 than the first region 532 because of the patterned photoresist layer. Thus, the first region 532 may be refereed as an indented region, and the second region 534 may be referred as a protrusion region.

Referring to 540 in FIG. 5A, the method includes removing the patterned photoresist layer from the substrate with a pressure sensitive adhesive (PSA) layer to remove the adhered quantum dots, such that a remaining portion of quantum dots forms a patterned quantum dot layer capped with the metal layer. When the PSA layer makes contact with the protrusion region 534 of the metal layer, the PSA layer may adhere to the protrusion region 534 and may not adhere to the indented region 532 because the indented region 532 is lower than the protrusion region 534. In one implementation, the PSA may include a flexible adhesive tape, and the PR layer may be removed by using the PSA to obtain a QD/metal composite layer array 542. The PSA may be gently brought into contact with the deposited layer on the transferred PR layer while taut to ensure that the PSA does not collapse and touch the deposited materials through PR opening. Thus, the size of the PR opening may depend on the thickness of the PR layer. For example but not limited to, when PR is about 4.5 µm thick, PR openings with square patterns may include about 500 µm by about 500 µm square trench. In another implementation, a rigid and flat adhesive layer may be used; the size of the PR opening may not depend on the thickness of the PR layer.

FIG. 5B shows optical microscope images corresponding to each step of the QD/metal composite layer array formation. An optical microscope image 571 of a grid patterned PR layer on a PDMS substrate is shown. An optical microscope image 572 of a transferred PR layer onto a QD film is shown. An optical microscope image 573 of deposited Cr and Au layer is shown. An optical microscope image 574 of a square patterned QD and metal composite layer after removing the PR layer using a PSA, i.e., dry lift-off, is shown. Scale bars 579 may represent 150 µm.

Figure 5C:
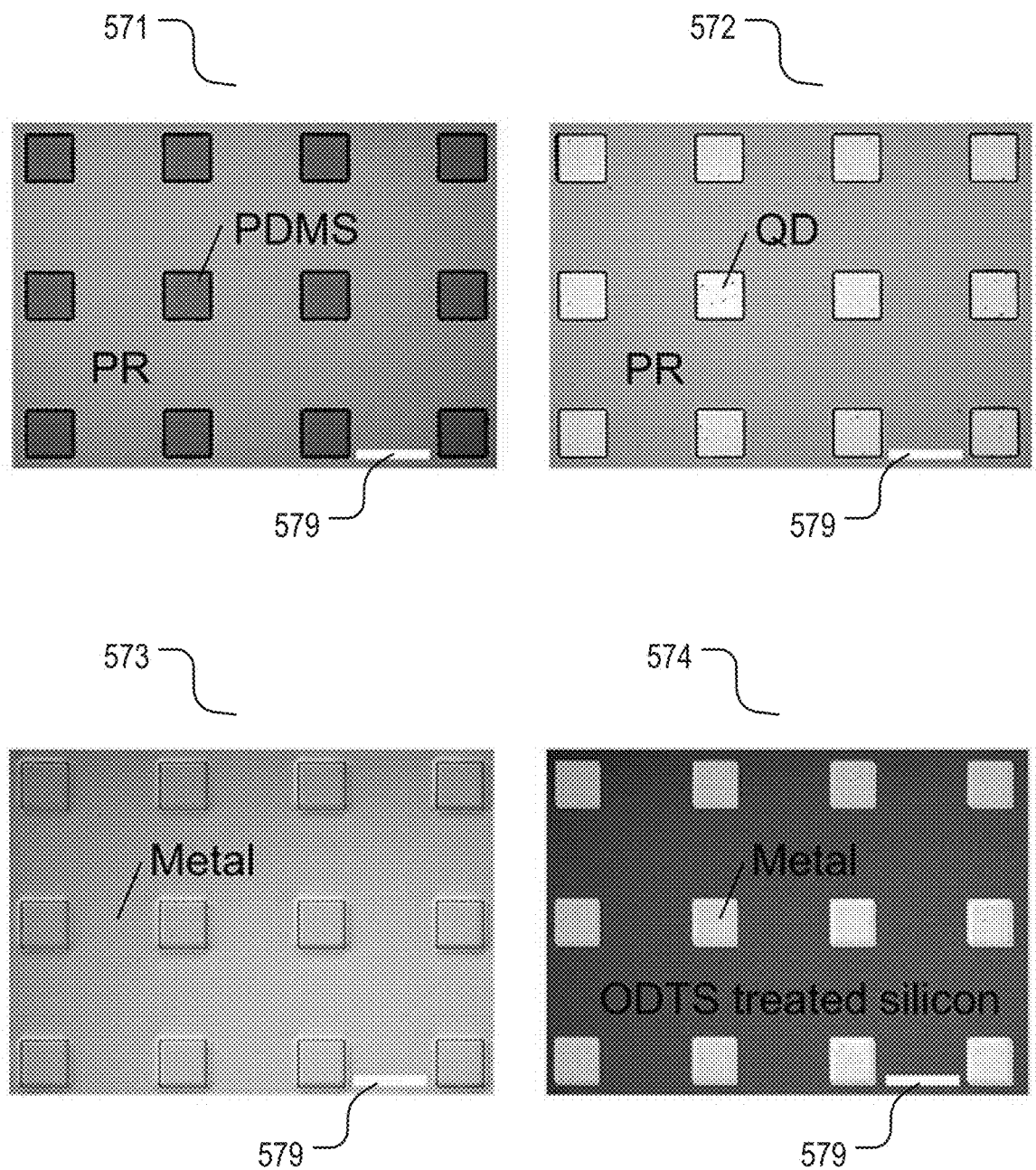
FIG. 5C is optical microscope images of a grid patterned PR layer on a PDMS substrate, a transferred PR layer onto a QD film, successively deposited Cr and Au, and a square patterned QD and metal composite layer after removing the PR layer using a PSA, i.e., dry lift-off. All scale bars represent 150 μm.

FIG. 5C includes images of a fully processed composite layer array, which show clear distinction between composite layer regions and the Si surface, indicating successful formation of the QD/metal composite layer array for subsequent transfer printing steps. In one implementation, this process based on PR contact transfer may use Cr and Au. In another implementation, materials of Cr and Au may be replaced by any material of interest as long as the material is deposited in dry (or with an orthogonal solvent) and relatively low temperature conditions such that the PR masking layer is not significantly damaged during the deposition process.

The present disclosure describes another embodiment of a method of PR contract patterning and transferring, wherein a transferring stamp may be used. In some implementations, this transferring method with a transferring stamp may be completely optionally. In other implementations, this transferring method with a transferring stamp may be used together with any one of the embodiments described above.

Figure 6A:
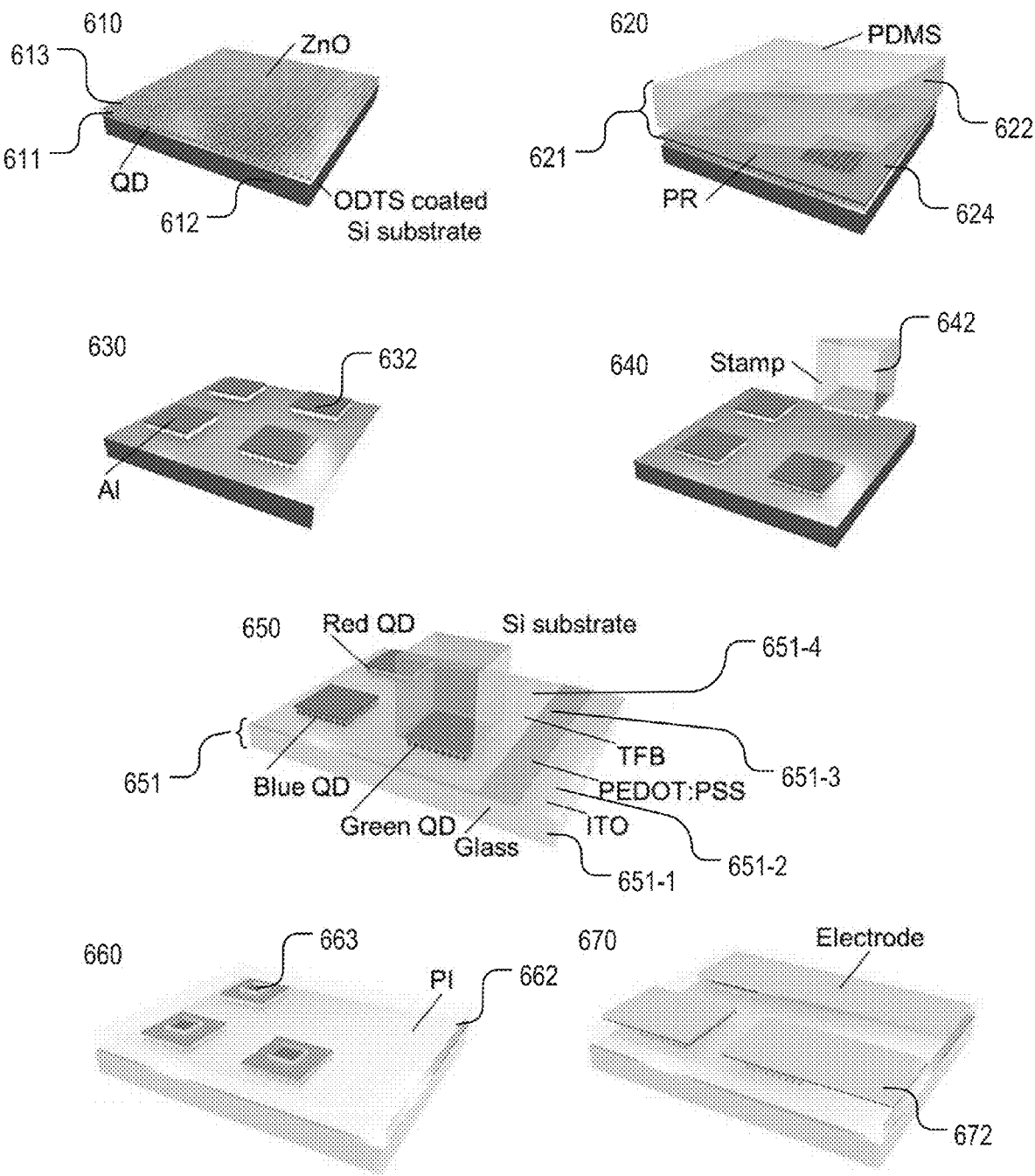
FIG. 6A is a schematic process flow of a method for fabricating red-green-blue (RGB) QD-light-emitting diodes (QD-LEDs). A ZnO layer is spin-cast and annealed on top of a QD film on an ODTS coated Si substrate. A patterned PR layer is transferred on the substrate via PR contact transfer. Al electrodes are formed by depositing and patterning, i.e., dry lift-off. A patterned QD/ZnO/Al composite layer is picked up by a PDMS or SMP stamp. The composite layers with RGB QDs are assembled on a separately prepared Glass/ITO/PEDOT:PSS/TFB substrate via transfer printing. A PI layer is coated on the assembled substrate and selective openings are made by selective plasma etching. Cr/Au wires are deposited and patterned.

The present disclosure describes one embodiment of creating device-level applications of PR contact transfer. Referring to FIG. 6A, a method including individual transfer printing steps may be used to fabricate QD-LED pixels.

Referring to 610 in FIG. 6A, one color (for example, green color) QD film 611 may be deposited on one ODTS coated Si donor substrate 612. Zinc oxide (ZnO) electron transport layer (ETL) is then deposited on the QD film to form a ZnO layer 613. Two other colors (for example, red and blue colors) QD films may be deposited and processed similarly as described for the green QD film, so that the final QD-LED pixel may include green, red, and blue color QDs.

Referring to 620 in FIG. 6A, a patterning stamp 621 including a patterned PR layer 624 and a substrate 622 may be used to patterning the QD layer 611. In one implementation, a patterned PR layer 624 may have a 100 μm square opening array, and the substrate 622 may include a PDMS layer. The patterned PR layer 624 may be transferred on top of the ZnO layer by PR contact transfer.

Referring to 630 in FIG. 6A, in one implementation, subsequent deposition of a 100 nm thick aluminum (Al) as the cathode and dry lift-off of the PR layer from the substrates complete the preparation of 100 μm square arrays 632 of QD/ZnO/Al composite layers on donor substrates for the following QD-LED assembly.

Referring to 640 in FIG. 6A, a transferring stamp 642 may remove one or more square array of the QD/ZnO/Al composite layers from the donor substrate to a receiving substrate. In one implementation, the transferring stamp 642 may include one of a PDMS or SMP stamp. Square pixels of each color (for example, green, red, or blue) QDs are picked up from their corresponding donor substrate using the transferring stamp and printed on the receiver substrate individually to form a group of RGB pixels.

Referring to 650 in FIG. 6A, the transferring stamp may transfer and print one square pixel of one color QDs on the receiving substrate 651. In one implementation, the receiving substrate may include a patterned indium tin oxide (ITO) layer 651-2 on a glass substrate 651-1. The receiving substrate may further include a poly(3,4-ethylenedioxythiophene) polystyrenesulfonate (PEDOT:PSS) layer 651-3 and poly[(9,9-dioctylfluorenyl-2,7-diyl)-co-(4,40-(N-(4-s-butylphenyl)) diphenylamine)] (TFB) layer 651-4. The PEDOT:PSS layer and the TFB layer may be sequential spin-cast onto the ITO layer and may undergo annealing process, and may function as a hole injection layer (HIL) and a hole transport layer (HTL), respectively. Transfer printing of the composite layers is enabled by a PDMS or SMP stamp. Square pixels of each color are picked up from RGB donor substrates using a transferring stamp and printed on the receiver substrate individually to form a group of RGB pixels.

Referring to 660 in FIG. 6A, a poly-imide (PI) layer 662 may be coated on the assembled substrate and selective openings 663 may be made by selective plasma etching. After transfer printing, the RGB pixels are encapsulated with a poly-imide (PI) layer which is selectively etched on top of the RGB pixels by reactive ion etching with $O_2/N_2$ plasma for making electrical contacts to the metal electrodes.

Referring to 670 in FIG. 6A, Cr/Au wires 672 may be deposited and patterned. After depositing and patterning Cr/Au wires, the fabricated QD-LED device may be encapsulated. Detailed procedures for full device fabrication are described below.

Figure 6B:
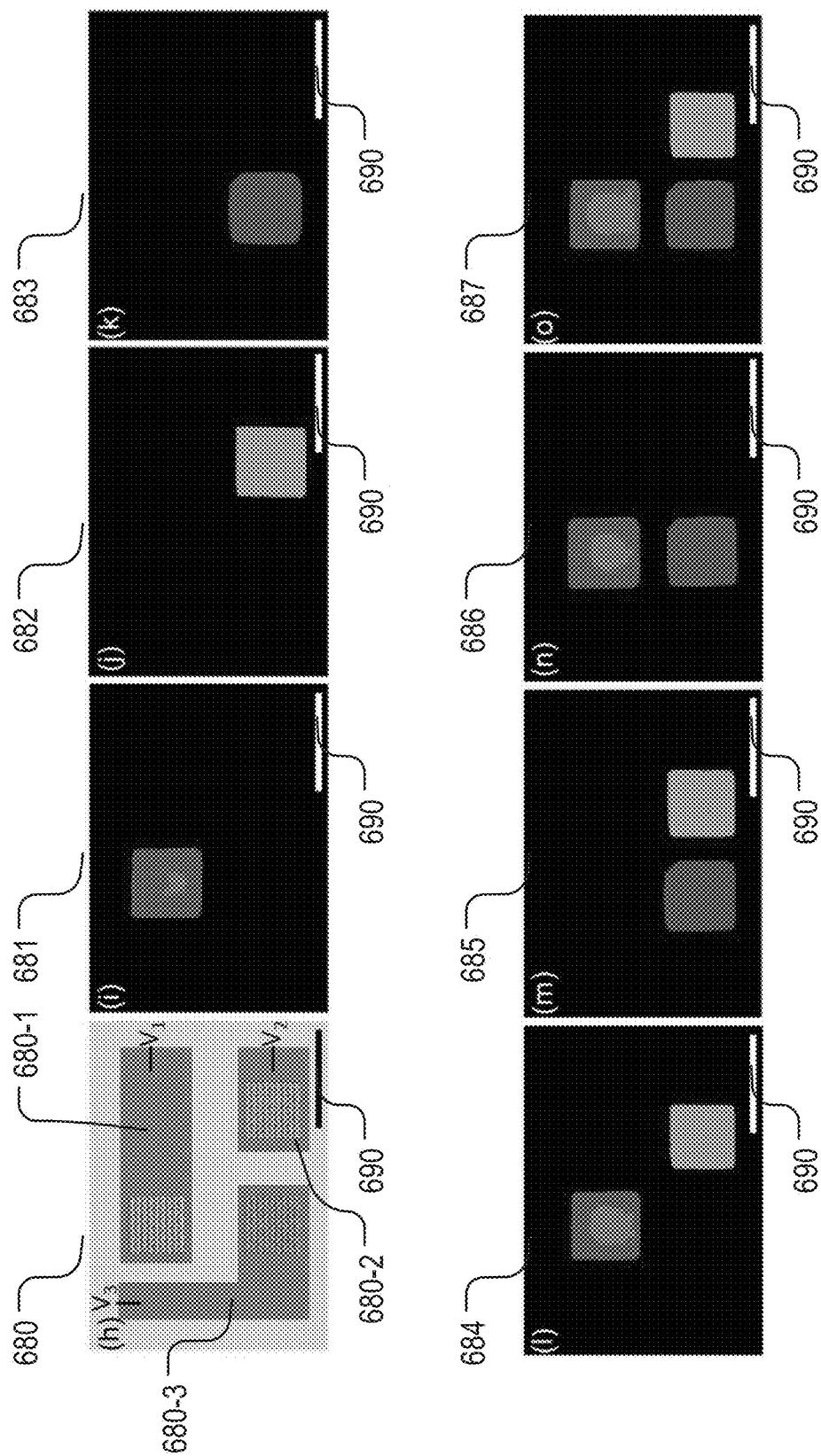
FIG. 6B is images of individual QD-LEDs. A schematic illustration of individually addressable RGB QD-LED pixels. Optical images of activated red, green, blue, red/green, green/blue, blue/red, red/green/blue QDs. All scale bars represent 150 μm.

For the QD-LED device fabricated in FIG. 6A, applying negative voltage to three separate electrodes through three wires with the ITO layer as the common ground may individually activate the corresponding RGB pixels, as shown in FIG. 6B. In one implementation, to produce similar brightness, the RGB pixels may be connected with different voltages. For example, about 6.1V is applied to a first electrode 680-1 for red QDs, about 9.5V is applied to a second electrode 680-2 for green QDs, and about 8.05V is applied to a third electrode 680-3 for blue QDs, respectively.

In another implementation, each RGB pixel may include different QDs and may have slightly different electroluminescence characteristics. The applied negative voltage may be modulated to match the brightness of the three RGB pixels.

FIG. 6B shows some optical microscope images of individually activated RGB pixels, dual activation of RG, GB and BR pixels, and activation of all three pixels. 680 shows a schematic illustration of individually addressable RGB QD-LED pixels. Optical images of activated red QDs 681, green QDs 682, blue QDs 683, red and green QDs 684, green and blue QDs 685, blue and red QDs 686, and all three colors (red, green, and blue) QDs 687. Scale bars 690 may represent 150 μm.

Figure 7A:
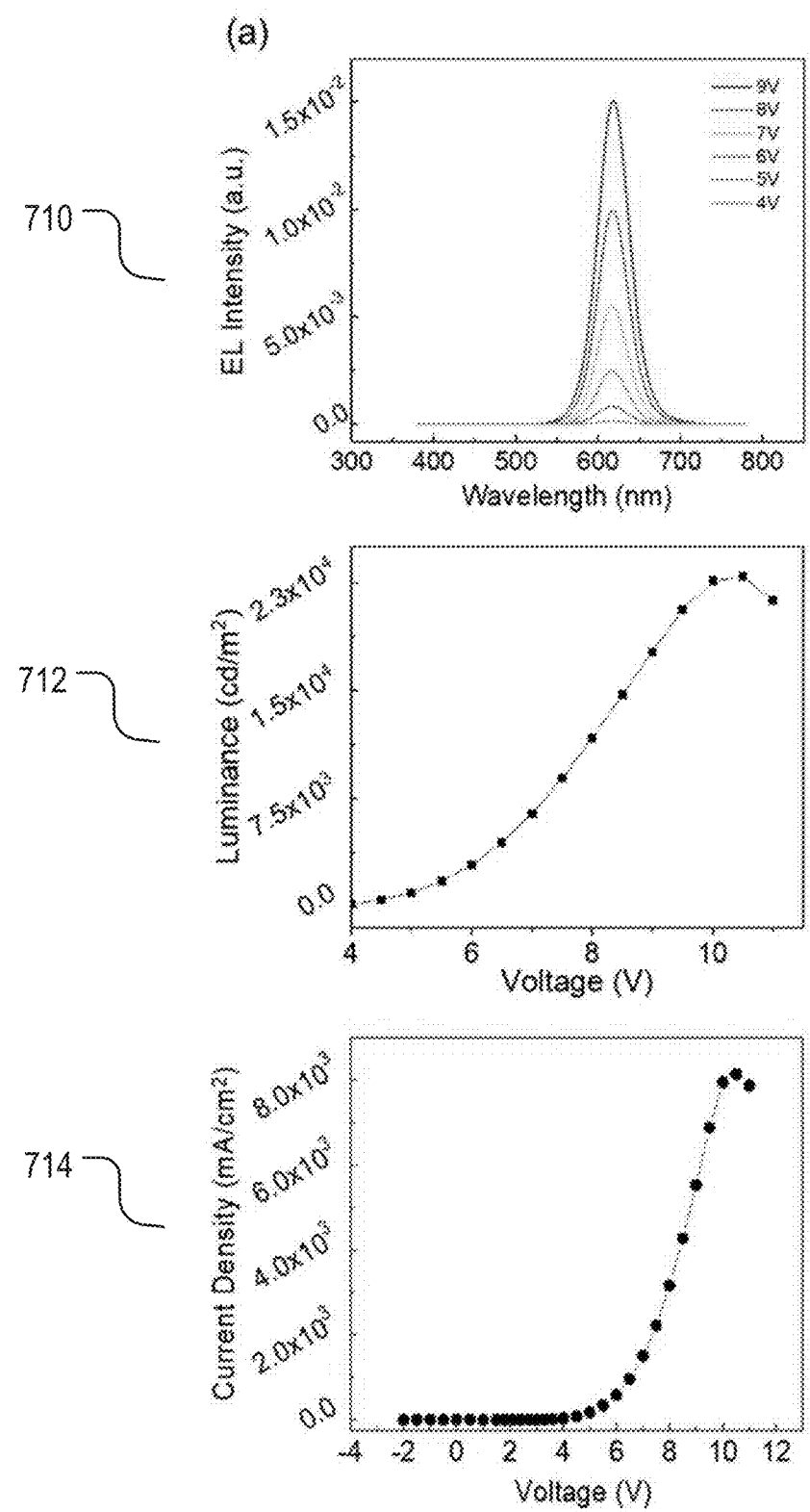
FIGS. 7A-7C are plots to show electroluminescence (EL) characteristics of RGB pixels. EL intensity versus wavelength plots (first row), luminance versus voltage plots (second row), and current density versus voltage plots (third low) of red, green, and blue LED pixels.
Figure 7B:
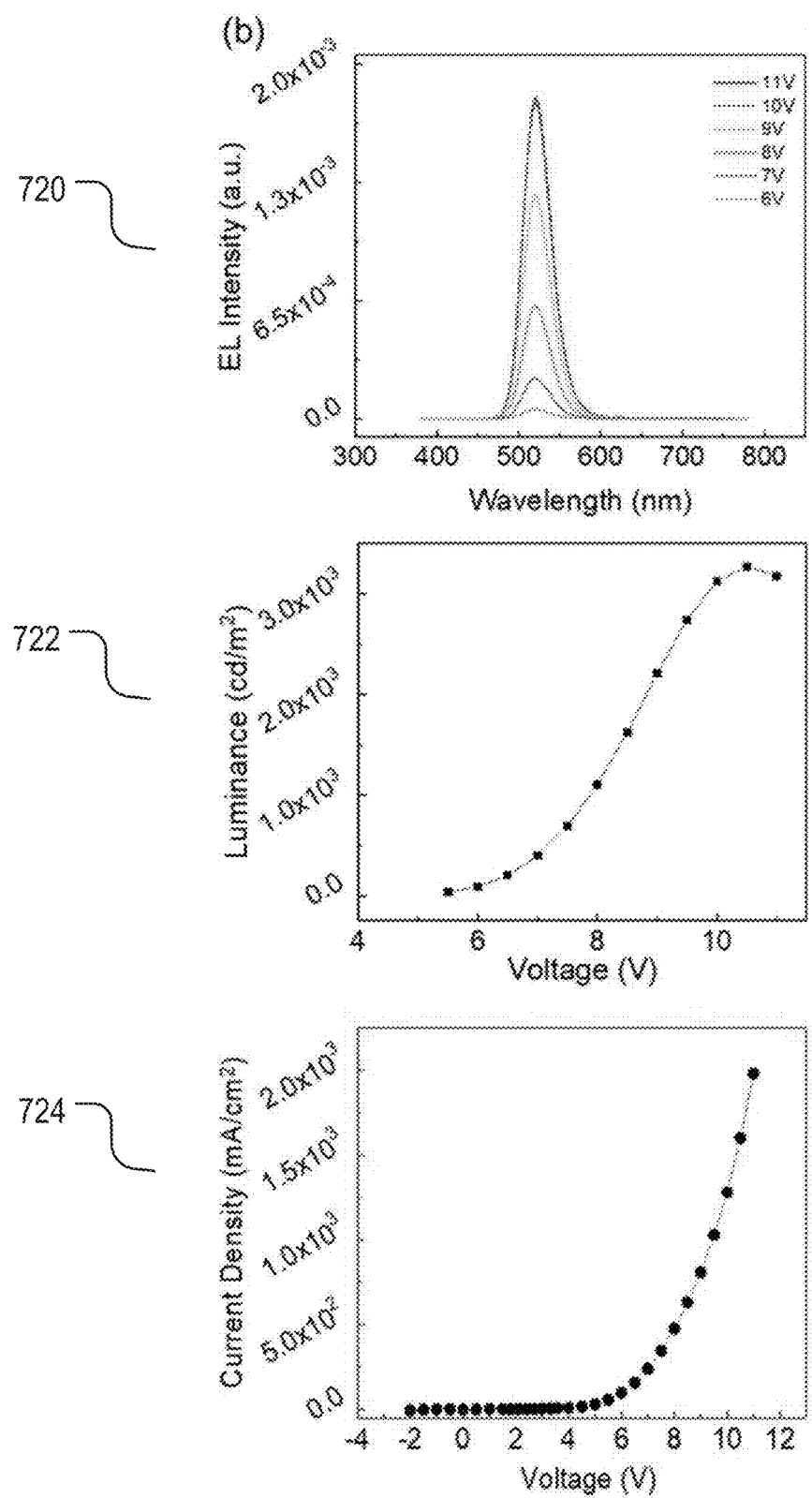

FIGS. 7A-7B shows electroluminescence (EL) characteristics of these QD-LED pixels.

FIG. 7A shows, for red pixels, an EL intensity versus wavelength plot 710, a luminance versus voltage plot 712, and a current density versus voltage plot 714.

FIG. 7B shows, for green pixels, an EL intensity versus wavelength plot 720, a luminance versus voltage plot 722, and a current density versus voltage plot 724.

Figure 7C:
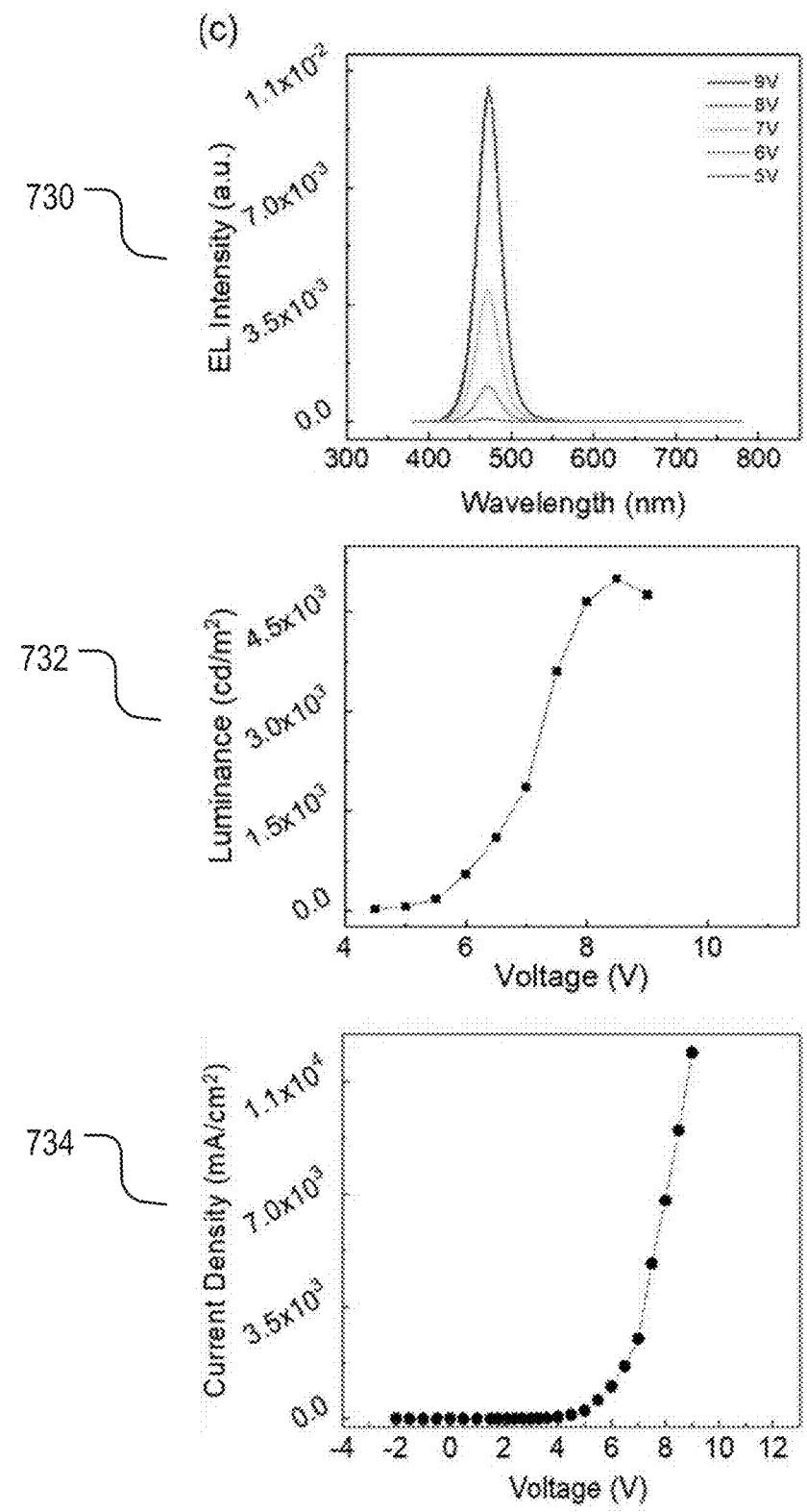

FIG. 7C shows, for blue pixels, an EL intensity versus wavelength plot 730, a luminance versus voltage plot 732, and a current density versus voltage plot 734.

In one embodiment, the method may use below chemicals as examples but not limitations. N-octadecylphosphonic acid (ODPA) may be from PCI synthesis. Poly[(9,9-dioctylfluorenyl-2,7-diyl)-co-(4,4'-(N-(4-butylphenyl))diphenylamine)] (TFB) may be from H.W. Sands Corp. SPR 220-4.5 may be from MicroChem. AZ 917 MIF may be from AZ Electronic Materials. Polydimethylsiloxane (PDMS, Sylgard 184) may be from Dow-Corning. ITO etchant may be from Transene Company. Polyimide precursor (PI-2454) and thinner (T9039) may be from HD Microsystems. Poly (3,4-ethylenedioxythiophene)-poly(styrenesulfonate) (PEDOT:PSS, CLEVIOS™ P VP AI 4083) may be from Heraeus. Cadmium oxide (CdO), 1-octadecene (ODE, 90%), oleic acid (OA, 90%), trioctylphosphine oxide (TOPO, 99%), trioctylphosphine (TOP, 97%), oleylamine (≥98%), selenium (Se) powder (99.999%), sulfur (S) powder (99.999%), tributylphosphine (TBP), zinc acetate ($Zn(OA)_2$, 99.99%), hexane (anhydrous, 95%), hexanes (≥98.5%), methanol (≥99.8%), acetone (≥99.5%), octane (≥99%) octadecyltrichlorosilane (ODTS, ≥90%), potassium hydroxide (≥85%), zinc acetate dihydrate (≥98%), 1-butanol (anhydrous, ≥99%), m-xylene (anhydrous, ≥99%), and 2,3,5,6-Tetrafluoro-7,7,8,8-tetracyanoquinodimethane ($F_4TCNQ$, 97%) may be from Sigma-Aldrich.

In one embodiment, the method may include the below steps to synthesize RGB QDs as examples but not limitations. Red, green and blue (RGB) QDs may be synthesized in a standard Schlenk line following established methods with slight modifications. The red CdSe/CdS core/shell QDs may be synthesized using a 2-pot procedure. In a first reaction flask, 0.06 g of CdO, 0.28 g of ODPA and 3 g of TOPO may be degassed at 150° C. for 1 h before being heated up to 350° C. to form Cd-ODPA. After adding 1 mL of TOP, 0.06 g Se in 0.5 mL TOP may be swiftly injected at 380° C., and the reaction may be quenched after 30 s. The obtained CdSe seed QDs may be purified by precipitation with acetone and then may be redispersed in hexanes. In the second step, 3 mL of ODE, 2 mL of oleyamine and the solution of CdSe seeds may be degassed at 100° C. for 1 h. 1.2 mL of the $Cd(OA)_2$ solution (stock solution may be prepared in a separate reaction flask by degassing a mixture of 0.128 g CdO, 0.64 mL oleic acid and 5.4 mL ODE at 100° C. for 30 min before heating up to 250° C.) may be then injected dropwise into the reaction mixture at 260° C. After finishing precursor injection, 1.2 equivalent amount (to $Cd(OA)_2$) of 1-octanethiol in ODE may be added dropwise to the reaction mixture, followed by a swift injection of 1 mL oleic acid. The reaction may be terminated by cooling with an air jet after 1 h of growth at 310° C. For purification, excess acetone may be added to the reaction mixture. The precipitate after centrifugation may be redissolved in hexanes and centrifuged again to remove the insoluble precipitate. The supernatant may be then purified twice by precipitating with methanol. The final QD product may be dispersed in octane (~60 mg/mL) for spin-casting. Transmission electron microscopy (TEM) images of QD core and QD core/shell images of red QD are shown in FIG. 8. To synthesize the green CdSe/ZnS alloy QDs, 0.2 mmol of CdO, 4 mmol of Zn acetate, 5 mL of oleic acid and 15 mL of ODE may be degassed at 110° C. for 1 h before being heated up to 300° C. A solution of 0.2 mmol of Se and 3 mmol of S in 2 mL of TOP may be then injected into the reaction mixture. The reaction may be quenched after 2 min of growth. The blue CdSe/ZnS alloy QDs may be synthesized in a similar manner. 1 mmol of CdO, 9 mmol of Zn acetate, 8 mL of oleic acid and 15 mL of ODE may be degassed at 110° C. for 1 h before being heated to 300° C. Then a solution of 0.2 mmol of Se and 1.8 mmol of S in 3 mL of ODE may be injected. After 10 minutes of growth, 4 mL of 2 M TBP-S may be injected at 30 mL/h using a syringe pump. The reaction may be terminated by cooling with an air jet after another 1 h of growth. The green and blue QDs may be purified three times by adding chloroform and excess amount of acetone. The final QD products may be dispersed in octane (~60 mg/mL) for spin-casting. Transmission electron microscopy(TEM) images of QD core and QD core/shell images of green and blue QDs are shown in FIG. 9 and FIG. 10, respectively.

In one embodiment, the method may include the below steps to prepare RGB QD films on ODTS coated Si substrates as examples but not limitations. The preparation of ODTS coated Si substrates may follow an established method with some modifications. Si substrates may be cleaned by acetone/isopropanol and dried with $N_2$ flow, and then further treated under $UV/O_3$ for 15 min. After $UV/O_3$ exposure, the Si substrates may be immediately transferred to ODTS in anhydrous hexane solution (1:600 volume ratio) and left for self-assembly for 1 h. The resulting substrates may be sonicated in chloroform to remove excess ODTS molecules and then baked on a hot plate at 120° C. for 20 min. Once the ODTS coated Si substrate is prepared, solutions of QDs in octane may be spin-cast onto the substrate.

In one embodiment, the method may include the below steps to prepare a patterned PR layer on a PDMS substrate as examples but not limitations. The SPR 220-4.5 photoresist (PR) may be spin-cast on a 1:10 ratio PDMS substrate at 3000 rpm for 30 seconds. The PR on the PDMS substrate may be soft baked on a hotplate at 65° C. and 110° C. for 1 min and 2 min, respectively. Subsequently, exposure to UV (I-line, ~210 mJ/cm$^2$) light under a photomask and development with AZ 917 MIF may form the predesigned patterns on the PR layer.

In one embodiment, the method may include the below steps to perform synthesis and deposition of ZnO as examples but not limitations. ZnO nanoparticles may be synthesized following a conventional method with modifications. A solution of potassium hydroxide (0.74 g) in methanol (65 ml) may be slowly added to zinc acetate dihydrate (2.95 g) in methanol (125 ml) solution and the reaction mixture may be stirred at 60° C. for 2 h. The mixture may be cooled to room temperature and allowed to stand and precipitate for 24 h. The precipitate may be then washed through two cycles of precipitation with methanol and centrifugation before being dissolved in 1-butanol with 30 mg/mL concentration. ZnO nanoparticles obtained after centrifugation may be directly weighed and dissolved without additional drying process. For film deposition, the solution of ZnO nanoparticles may be drawn with a syringe and applied onto the device substrate through a 0.2 μm pore size PTFE membrane syringe filter. This solution may be spin-cast at 2,000 rpm for 30 s and the substrate may be annealed on a hotplate at 120° C. for 30 min.

In one embodiment, the method may include the below steps to prepare ITO patterned substrates as examples but not limitations. ITO substrates may be from Sigma-Aldrich (surface resistivity 15-25 Ω/sq). The ITO substrates may be patterned by photolithography to obtain 2 mm pixel width. AZ5214 photoresist may be used for patterning. After developing the photoresist, the substrates may be dipped in an ITO etchant bath for 20 minutes on a 90° C. hotplate, before rinsing with water. The patterned ITO substrates may be wiped clean with acetone and Kimwipe, and then rinsed with acetone, isopropanol, DI water and then isopropanol again before drying with a nitrogen flow. After this cleaning step, the ITO substrates may be exposed to $UV/O_3$ for 15 min for further cleaning and to achieve a more hydrophilic surface. The next step of spin-casting PEDOT:PSS may be carried out immediately after the $UV/O_3$ treatment due to the short duration of $UV/O_3$ effect.

In one embodiment, the method may include the below steps to perform deposition of PEDOT:PSS as examples but not limitations. A sufficient amount of PEDOT:PSS may be drawn with a syringe, and applied onto the substrate through a 0.45 μm pore size PVDF membrane syringe filter. The solution may be then spin-cast at 4,000 rpm for 40 s. The obtained PEDOT:PSS film may be annealed on a 125° C. hotplate for 5 minutes in air to remove moisture before the samples may be transferred into a $N_2$ filled glovebox (with $O_2$ and $H_2O$ levels <10 ppm, more typically <1 ppm) for subsequent fabrication steps. The substrates with PEDOT:PSS may be further annealed on a 210° C. hotplate for 10 min in the glovebox.

In one embodiment, the method may include the below steps to perform deposition of TFB/$F_4$TCNQ as examples but not limitations. 5 mg of TFB and 2 mg of $F_4$TCNQ may be weighed in a glass vial, and dissolved in 1 mL m-xylene in $N_2$-filled glovebox. The mixture may be heated on a hotplate at 80° C. for ~10 min or until the chemicals may be fully dissolved to give a dark red-brown color solution with no visible precipitates. The HTL solution may be drawn with a syringe and applied onto the substrates through a 0.2 μm pore size PTFE membrane syringe filter. The solution may be then spin-cast at 3,000 rpm for 30 s before being annealed on a hotplate at 180° C. for 30 min. After finishing the preparation of donor and receiver substrates, the samples may be taken out of the glovebox for patterning and transfer printing. To minimize air exposure, the samples may be sealed in a vacuumed bag before being transferred out of the glovebox.

In one embodiment, the method may include the below steps to perform deposition and patterning of poly-imide (PI) and encapsulation as examples but not limitations. Thick PI precursor (PI-2454) may be mixed with a thinner (T9039 HD) at 1:3 volume ratio by stirring with magnetic stirring at 250 RPM for 24 hours. The thinned PI precursor may be spin-coated on top of an assembled QD-LED device at 3000 rpm for 30 s, then the substrate may be annealed in a vacuum oven at 200° C. for 1.5 hours. The patterning of the PI layer may be carried out using AZ 5214 photoresist on top of the PI layer. Using the patterned photoresist as an etching mask, the PI layer may be etched with reactive ion etching (RIE) with flow rate of $O_2$ 2 sccm and $N_2$ 1 sccm and RF power 100 W for 10 minutes. The masking photoresist layer may be subsequently removed by acetone rinsing. Once the device fabrication is finished, the substrate may be brought back into the glove box for encapsulation using Norland products NOA86 epoxy and a glass coverslip.

In one embodiment, the method may include the below steps to perform characterization as examples but not limitations. The photoluminescence (PL) imaging of QD patterns may be collected using a Leica SP8 UV/Visible Laser Confocal Microscope with a 405 nm laser as excitation source and an oil immersion objective (40×/1.30 HC PL APO Oil CS2). Band pass ranges may be selected to be ±10 nm of the PL peak positions of RGB QDs, which may be 616 nm, 516 nm, 470 nm respectively. The PL spectra of patterned QD films may be collected with a Horiba Jobin Yvon FluoroMax-3 spectrofluorometer using a 400 nm excitation. All QD-LED device measurements may be performed in air. Eectroluminescence (EL) may be characterized using a Spectrascan PR-655 spectroradiometer coupled with a Keithely 2602B source-measure unit. The scanning electron microscope (SEM) images of QD films may be collected using Hitach S-4800 SEM. The optical images of QD films and QD-LED devices may be collected using Olympus microscope MX 50.

While the particular disclosure has been described with reference to illustrative embodiments, this description is not meant to be limiting. Various modifications of the illustrative embodiments and additional embodiments of the invention will be apparent to one of ordinary skill in the art from this description. Those skilled in the art will readily recognize that these and various other modifications can be made to the exemplary embodiments, illustrated and described herein, without departing from the spirit and scope of the present invention. It is therefore contemplated that the appended claims will cover any such modifications and alternate embodiments. Certain proportions within the illustrations may be exaggerated, while other proportions may be minimized. Accordingly, the disclosure and the figures are to be regarded as illustrative rather than restrictive.

What is claimed is:

1. A method for creating a patterned quantum dot layer, the method comprising:
    bringing a patterning stamp in contact with a layer of quantum dots disposed on a substrate, the patterning stamp comprising a patterned photoresist layer disposed on an elastomer layer, such that a portion of the quantum dots in contact with the patterned photoresist layer adheres to the patterning stamp, the portion of the quantum dots being adhered quantum dots; and
    peeling the patterning stamp from the substrate with a peeling speed larger than a pre-determined peeling speed to remove the adhered quantum dots from the substrate, wherein a remaining portion of the quantum dots forms a patterned quantum dot layer on the substrate.

2. The method according to claim 1, the method further comprising:
    spin-casting a solution of quantum dots on the substrate to form the layer of quantum dots.

3. The method according to claim 1, wherein:
    the elastomer layer comprises a polydimethysiloxane (PDMS) layer.

4. The method according to claim 1, wherein:
    the substrate comprises a silicon substrate coated with octadecyltrichlorosilane (ODTS).

5. The method according to claim 1, wherein:
    the pre-determined peeling speed is 1 cm per second.

6. The method according to claim 1, further comprising:
    prior to bringing the patterning stamp in contact with the quantum dots, photolithographically patterning a photoresist film on the elastomeric layer to form the patterned photoresist layer on the elastomer layer.

7. The method according to claim 1, further comprising:
    before bringing the patterning stamp in contact with the layer of quantum dots disposed on the substrate, heating the patterning stamp to about 65° C.; and
    before peeling the patterning stamp from the substrate, cooling down the patterning stamp.

8. The method according to claim 1, the method further comprising:
    bringing a transferring stamp in contact with a transferring portion of the pattern quantum dot layer so as to adhere to the transferring portion, the transferring portion of the pattern quantum dot layer being transferring quantum dots;
    moving the transferring stamp comprising the transferring quantum dots from the substrate to a desired location with respect to a receiving substrate;
    contacting the transferring quantum dots with the receiving substrate; and
    removing the transferring stamp from the receiving substrate, the transferring quantum dots being released such that the transferring quantum dots remain on the receiving substrate to form a second patterned quantum dot layer.

9. The method according to claim 8, wherein:
    the transferring stamp comprises at least one of an elastomer stamp or a shape memory polymer (SMP) stamp.

10. The method according to claim 9, wherein:
    the elastomer stamp comprises a PDMS stamp.

* * * * *